(12) United States Patent
Hasegawa et al.

(10) Patent No.: US 7,029,771 B2
(45) Date of Patent: Apr. 18, 2006

(54) MAGNETIC SENSOR HAVING FREE LAYER ADDITIONALLY PROVIDED WITH MAGNETIC ANISOTROPY BY SHAPE ANISOTROPY

(75) Inventors: Naoya Hasegawa, Niigata-ken (JP); Eiji Umetsu, Niigata-ken (JP); Masamichi Saito, Niigata-ken (JP); Yosuke Ide, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 163 days.

(21) Appl. No.: 10/671,970

(22) Filed: Sep. 26, 2003

(65) Prior Publication Data
US 2004/0067389 A1 Apr. 8, 2004

(30) Foreign Application Priority Data
Oct. 7, 2002 (JP) .............................. 2002-293365
Feb. 26, 2003 (JP) .............................. 2003-048727

(51) Int. Cl.
*G11B 5/127* (2006.01)
(52) U.S. Cl. ................... 428/811.5; 428/812; 428/813; 428/816; 360/324.11
(58) Field of Classification Search ..................... None
See application file for complete search history.

(56) References Cited

U.S. PATENT DOCUMENTS

| | | | | |
|---|---|---|---|---|
| 5,949,623 | A * | 9/1999 | Lin | ........................ 360/324.12 |
| 6,030,753 | A | 2/2000 | Lin | |
| 6,364,964 | B1 * | 4/2002 | Sasaki et al. | ................ 148/121 |
| 2001/0014000 | A1 * | 8/2001 | Tanaka et al. | .......... 360/324.12 |
| 2002/0048690 | A1 * | 4/2002 | Fukuzawa et al. | ........... 428/692 |
| 2003/0179516 | A1 * | 9/2003 | Freitag et al. | .......... 360/324.11 |
| 2004/0004792 | A1 * | 1/2004 | Hasegawa et al. | ...... 360/324.12 |
| 2004/0207962 | A1 * | 10/2004 | Saito et al. | ............. 360/324.11 |
| 2005/0018363 | A1 * | 1/2005 | Hasegawa et al. | ........ 360/324.1 |

FOREIGN PATENT DOCUMENTS

| | | |
|---|---|---|
| JP | 08-007225 | 1/1996 |
| JP | 2000-163717 | 6/2000 |
| JP | 2001-256617 | 9/2001 |

OTHER PUBLICATIONS

Pending claims of co-assigned application 10/675,435.*

* cited by examiner

*Primary Examiner*—Kevin M. Bernatz
(74) *Attorney, Agent, or Firm*—Brinks Hofer Gilson & Lione

(57) ABSTRACT

An intermediate region is formed at a central portion of an element in a track width direction, and an antiferromagnetic layer is not provided at the intermediate region. Accordingly, a sense current can be prevented from being shunted to the intermediate region, and as a result, improvement in reproduction output and strength against magnetic electrostatic damage can be realized. In addition, since the thickness of the central portion of the element is decreased, trend toward narrower gap can be realized. Furthermore, since the direction of magnetization of a free magnetic layer is oriented in the track width direction by shape anisotropy, means for orienting the magnetization is not necessary, and hence the structure and manufacturing method of the element can be simplified.

27 Claims, 20 Drawing Sheets

FIG 20
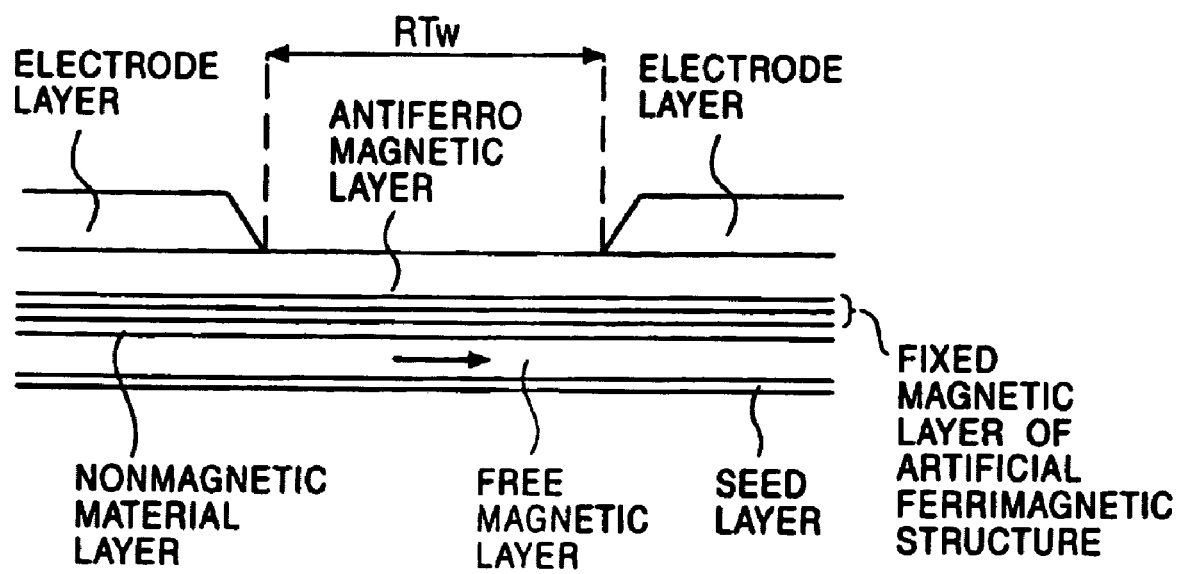
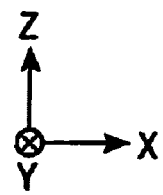

MAGNETIC SENSOR HAVING FREE LAYER ADDITIONALLY PROVIDED WITH MAGNETIC ANISOTROPY BY SHAPE ANISOTROPY

BACKGROUND OF THE INVENTION

1. Field of the Invention

The present invention relates to magnetic sensors such as a spin-valve type thin film element mounted on hard disc devices or the like, and more particularly, relates to a magnetic sensor in which an exchange coupling region between a fixed magnetic layer and an antiferromagnetic layer is specifically defined.

2. Description of the Related Art

In a related spin-valve type magnetic sensor, a free magnetic layer, a nonmagnetic material layer, a fixed magnetic layer, and an antiferromagnetic layer are provided to form a multilayer structure, and the magnetization of the fixed magnetic layer is fixed in a predetermined direction. In addition, a vertical bias magnetic field is applied to each side of the free magnetic layer, and the direction of magnetization thereof is oriented so as to cross that of the fixed magnetic layer. In this type of magnetic sensor, a lower shield layer and an upper shield layer are provided at the top and the bottom of the multilayer structure with gap layers therebetween, and the distance between the lower shield layer and the upper shield layer determines the resolution of detecting an external magnetic field.

However, heretofore, since the antiferromagnetic layer is provided over the entire fixed magnetic layer, the thickness of the multilayer structure is increased in the layered direction. Hence, the distance between the upper shield layer and the lower shield layer is increased, and as a result, there is a limit to improve the resolution.

Accordingly, in a magnetic sensor disclosed in Japanese Unexamined Patent Application Publication No. 2000-163717, a thin part is formed at a central portion of an antiferromagnetic layer in a width direction. The thin part described above is formed so as to decrease the distance between shield layers provided at the top and the bottom.

Since the thin part is formed at the central portion of the antiferromagnetic layer, the distance between the shield layers can be advantageously decreased. However, since being formed so as to fix the direction of magnetization of a fixed magnetic layer, the thin part must have a certain level of thickness. Hence, a relatively large sense current cannot be prevented from being shunted from an electrode layer to the thin part, and as a result, a current loss occurs, thereby decreasing reproduction output.

In addition, in a magnetic sensor in which an antiferromagnetic layer is provided on a fixed magnetic layer, when a transient current flows from an electrode layer by electrostatic discharge (ESD), heat is generated in the element, and the temperature thereof may be increased close to a blocking temperature of the antiferromagnetic layer in some cases. In this case, as disclosed in Japanese Unexamined Patent Application Publication No. 2000-163717, when a thin antiferromagnetic layer, which generates exchange coupling, is present at the central portion of the fixed magnetic layer in the track width direction, the exchange coupling with the fixed magnetic layer at this thin part becomes unstable.

In particular, when the fixed magnetic layer is formed of a single magnetic layer, the magnetization may not be tightly fixed in many cases. Even in a synthetic ferrimagnetic structure in which the fixed magnetic layer has a first and a second magnetic layer, which are magnetized in an antiparallel state by the RKKY coupling, when one of the magnetic layers is formed so as to be in contact with the antiferromagnetic layer, and the exchange coupling with the antiferromagnetic layer becomes unstable, the direction of magnetization of the magnetic layer in contact with the antiferromagnetic layer is reversed, and as a result, the fixed magnetization of the fixed magnetic layer becomes unstable.

As described above, according to the magnetic sensor disclosed in Japanese Unexamined Patent Application Publication No. 2000-163717, since the antiferromagnetic layer in a magnetic sensing region is intentionally formed thin, a phenomenon in which the fixed magnetization of the fixed magnetic layer becomes unstable as described above cannot be avoided.

In addition, a magnetic sensor disclosed in Japanese Unexamined Patent Application Publication No. 8-7235 has a buffer layer formed of tantalum (Ta) as an underlayer and a pinned ferromagnetic layer provided thereon. The pinned ferromagnetic layer has a multilayer structure composed of a first cobalt (Co) film, a second cobalt (Co) film, and a ruthenium (Ru) film provided therebetween. The magnetizations of the first Co film and the second Co film are fixed by individual anisotropic magnetic fields. The first Co film and the second Co film are antiferromagnetically coupled with each other and are magnetized in the directions antiparallel to each other.

According to this magnetic sensor, an antiferromagnetic layer for fixing the magnetization of the pinned ferromagnetic layer is not provided, unlike that disclosed in Japanese Unexamined Patent Application Publication No. 2000-163713. Hence, compared to the case of Japanese Unexamined Patent Application Publication No. 2000-163713, the shunt loss can be decreased.

However, in the structure in which Co films are provided on a buffer layer composed tantalum, as described above in Japanese Unexamined Patent Application Publication No. 8-7235, it was found that the direction of magnetization of the pinned ferromagnetic layer cannot be appropriately fixed. This problem is also described in Japanese Unexamined Patent Application Publication No. 2000-113418.

A magnetic sensor disclosed in Japanese Unexamined Patent Application Publication No. 2000-113418 solves the problem which occurs in the magnetic sensor in Japanese Unexamined Patent Application Publication No. 8-7235. In this magnetic sensor, the ferromagnetic layer of a laminated ferri-fixed layer is formed of CoFe or CoFeNi, thereby improving the induced anisotropy.

In Japanese Unexamined Patent Application Publication No. 2000-113418, the structure in which an underlayer composed of Ta is provided under the laminated ferri-fixed layer is also disclosed; however according to the experimental results (FIGS. 4 to 7 of Japanese Unexamined Patent Application Publication No. 2000-113418) obtained from two cases in which the Ta underlayer is provided and is not provided, when a CoFe alloy is used for the ferromagnetic layer, the coercive force and the change in magnetoresistance are both increased when the Ta underlayer is not provided.

According to the description in Japanese Unexamined Patent Application Publication No. 2000-113418, in order to increase the induced anisotropy of the laminated ferri-fixed layer, a CoFe alloy is used for the ferromagnetic layer, and the magnetostriction thereof is set to positive.

In order to fix the magnetization of a self-pinning type fixed magnetic layer, the most important factor is uniaxial anisotropy derived from magnetoelastic energy of the fixed magnetic layer. In particular, the optimization of the magnetostriction of the fixed magnetic layer is most important. However, in Japanese Unexamined Patent Application Publication No. 2000-113418, the mechanism for optimizing the magnetostriction of the fixed magnetic layer is not discussed, and a particular structure for optimizing the magnetostriction of the fixed magnetic layer is not described at all.

As described above, in the past, the structure has not been available in which the magnetization of the fixed magnetic layer can be tightly fixed, the reproduction output can be improved, a narrower gap can be achieved, and electrostatic damage can be appropriately suppressed.

In addition, in a related spin-valve type magnetic sensor, since a vertical bias layer is provided for stabilizing the direction of magnetization of the free magnetic layer, the multilayer structure thereof is complicated, and as a result, the manufacturing cost is increased.

SUMMARY OF THE INVENTION

Accordingly, the present invention was made to solve the problems described above, and an object of the present invention is to provide a magnetic sensor in which the thickness of a multilayer film provided in a region having a magnetic detection function is decreased, the shunt of a sense current is decreased, and the magnetization of a fixed magnetic layer can be stabilized.

A magnetic sensor in accordance with one aspect of the present invention comprises: a free magnetic layer in which the direction of magnetization is changed in response to an external magnetic field; a fixed magnetic layer in which the direction of magnetization is fixed; a nonmagnetic material layer provided between the free magnetic layer and the fixed magnetic layer; and antiferromagnetic layers fixing the magnetization of the fixed magnetic layer by exchange coupling. In the magnetic sensor described above, the lengths in a first direction of the free magnetic layer, the nonmagnetic material layer, and the fixed magnetic layer are formed larger than the respective widths thereof in a second direction orthogonal to the first direction; the direction of magnetization of the free magnetic layer is preferentially oriented in the first direction by shape anisotropy; the fixed magnetic layer has a multilayer structure composed of a second magnetic layer in contact with the nonmagnetic material layer, an interlayer, and a first magnetic layer provided in that order; the antiferromagnetic layers are provided with an intermediate region having a predetermined length provided therebetween in the first direction so as to be in contact with the first magnetic layer; the direction of magnetization of the first magnetic layer is fixed by the exchange coupling in the direction crossing the first direction; and the direction of magnetization of the second magnetic layer is fixed antiparallel to that of the first magnetic layer, and electrical resistance is changed by the direction of magnetization of the free magnetic layer and that of the fixed magnetic layer at the intermediate region.

According to the magnetic sensor of the present invention, at the intermediate region described above, the exchange coupling is not generated between the fixed magnetic layer and the antiferromagnetic layer, or even when generated, the exchange coupling is so weak that the magnetization of the fixed magnetic layer cannot be fixed by itself. However, when the fixed magnetic layer is formed so as to have a synthetic ferrimagnetic structure including the first magnetic layer and the second magnetic layer, the magnetization of the fixed magnetic layer can be stabilized even at the intermediate region.

As described above, at the above intermediate region, for example, the exchange coupling between the fixed magnetic layer and the antiferromagnetic layer is not generated, even when the intermediate region is heated to a high temperature by a transient current caused by electrostatic discharge (ESD), the exchange coupling between the antiferromagnetic layer and the fixed magnetic layer will not become unstable at all.

In addition, the magnetic sensor described above may further comprise a nonmagnetic metal layer at the intermediate region. The nonmagnetic metal layer preferably has the same composition as that of the antiferromagnetic layer, is in contact with the first magnetic layer, and has a small thickness as compared to that of the antiferromagnetic layer so as to form an irregular crystal layer which does not exhibit antiferromagnetic properties.

In the case described above, since the nonmagnetic metal layer, which is provided at the intermediate region and has the same composition as that of the antiferromagnetic layer, has a very small thickness so as to have an irregular crystal structure that cannot exhibit antiferromagnetic properties, the loss of the magnetoresistive effect caused by the shunt of sense current described above can be decreased. In addition, since the nonmagnetic metal layer at the intermediate region has no antiferromagnetic properties, the exchange coupling with the fixed magnetic layer is not substantially generated, and as a result, the magnetization of the fixed magnetic layer will not become unstable at a high temperature.

In addition, according to the present invention, the crystal of the nonmagnetic metal layer and the fixed magnetic layer at the intermediate region are preferably placed in an epitaxial or a heteroepitaxial state, and the fixed magnetic layer preferably has an open end surface at a face opposing a recording medium.

It is preferable that the magnetization of part of the fixed magnetic layer facing the nonmagnetic metal layer in the thickness direction be also fixed tightly by uniaxial anisotropy of the fixed magnetic layer itself.

As factors determining the magnetic anisotropic magnetic field of a ferromagnetic layer, for example, there may be mentioned crystal magnetic anisotropy, induced magnetic anisotropy, and a magnetoelastic effect. Among those mentioned above, in a film having a polycrystalline structure in which crystal grains are randomly oriented, it is difficult to obtain uniaxial anisotropy by the crystal magnetic anisotropy. On the other hand, when a magnetic field is applied to a film in one direction when it is formed or is processed by heat treatment, uniaxial anisotropy resulting from the induced magnetic anisotropy is obtained, and when a uniaxial stress is applied, due to the magnetoelastic effect, uniaxial anisotropy is obtained.

Of the induced magnetic anisotropy and the magnetoelastic effect, which determines the uniaxial anisotropy fixing the magnetization of the fixed magnetic layer at the intermediate region, the magnetoelastic effect is primarily used in the present invention.

The magnetoelastic effect is generated by magnetoelastic energy. The magnetoelastic energy is defined by a stress applied to the fixed magnetic layer and the magnetostriction constant at the central portion thereof.

In the present invention, since the end surface of the fixed magnetic layer at the face opposing a recording medium is an open end surface, the symmetry of stresses generated, for example, by gap layers which originally have two-dimensional isotropy, is no longer maintained, and as a result, a tensile stress is applied to the fixed magnetic layer in the height direction. In addition, since the first magnetic layer is formed of a magnetic material having a positive magnetostriction constant, by the magnetoelastic effect, the easy axis of magnetization of the first magnetic layer becomes parallel to the direction (height direction) toward the rear side, and the direction of magnetization of the first magnetic layer is fixed parallel or antiparallel to the height direction.

In the present invention, the magnetoelastic energy is increased by increasing the magnetostriction constant of the fixed magnetic layer at the intermediate region, and in accordance with this increase, the uniaxial anisotropy of the fixed magnetic layer at the intermediate region is enhanced. When the uniaxial anisotropy of the fixed magnetic layer at the intermediate region is enhanced, since the magnetization of the fixed magnetic layer at the intermediate region is likely to be tightly fixed in a predetermined direction, the output of the magnetic sensor is increased, and the stability and the symmetry of the output are also improved.

The entire nonmagnetic metal layer described above or a part thereof in the vicinity of the interface with the first magnetic layer of the fixed magnetic layer may have a face-centered cubic (fcc) structure, and it is preferable that equivalent crystal planes represented by a {111} plane are preferentially oriented in the direction parallel to the interface.

In order to obtain the structure described above, for example, the nonmagnetic metal layer is preferably formed of a PtMn alloy or an X—Mn alloy (where X is at least one of platinum (Pt), palladium (Pd), iridium (Ir), rhodium (Rh), ruthenium (Ru), osmium (Os), nickel (Ni), and iron (Fe)).

The crystal structure of the nonmagnetic metal layer formed of a PtMn alloy or an M—Mn alloy (where X is at least one of Pt, Pd, Ir, Rh, Ru, Os, Ni, and Fe) maintains a face-centered cubic (fcc) structure which is formed in film formation.

When the nonmagnetic metal layer described above is brought into contact with the first magnetic layer at the intermediate region, a strain is generated in the crystal structure of the first magnetic layer at the intermediate region, and hence the magnetostriction constant of the first magnetic layer at the intermediate region can be increased.

In this case, the thickness of the nonmagnetic metal layer is preferably in the range of from 5 to 50 Å.

In addition, the entire first magnetic layer of the fixed magnetic layer or a part thereof at least at the intermediate region in the vicinity of the interface with the nonmagnetic metal layer may have a face-centered cubic (fcc) structure, and it is preferable that equivalent crystal planes represented by a {111} plane be preferentially oriented in the direction parallel to the interface.

As described above, in the nonmagnetic metal layer of the present invention, for example, an fcc structure is formed, and equivalent crystal planes represented by a {111} plane are preferentially oriented in the direction parallel to the interface.

Accordingly, when the first magnetic layer at least at the intermediate region has an fcc structure in which equivalent crystal planes represented by a {111} plane are preferentially oriented in the direction parallel to the interface described above, atoms forming the first magnetic layer and atoms forming the nonmagnetic metal layer are likely to be aligned with each other at the intermediate region.

However, since a certain difference is generated between the nearest interatomic distance of the {111} plane of the first magnetic layer at the intermediate region and the nearest interatomic distance of the {111} plane of the nonmagnetic metal layer, while the atoms forming the first magnetic layer and the atoms forming the nonmagnetic metal layer are being aligned with each other in the vicinity of the interface therebetween, a strain is generated in each crystal structure. That is, by generating the strain in the crystal structure of the first magnetic layer at the intermediate region, the magnetostriction constant can be increased.

For example, when the first magnetic layer of the fixed magnetic layer is formed of Co or $Co_xFe_y$ (where $y \leq 20$ and $x+y=100$ are satisfied), the first magnetic layer at the intermediate region has an fcc structure, and equivalent crystal planes represented by a {111} plane are preferably oriented in the direction parallel to the interface described above.

Alternatively, the entire first magnetic layer of the fixed magnetic layer or a part thereof at least at the intermediate region in the vicinity of the interface with the nonmagnetic metal layer may have a body-centered cubic (bcc) structure, and it is preferable that equivalent planes represented by a {110} plane be preferentially oriented in the direction parallel to the interface.

Even when the first magnetic layer at the intermediate region has a bcc structure, and the equivalent planes represented by a {110} plane are preferentially oriented in the direction parallel to the interface, the atoms forming the first magnetic layer and the atoms forming the nonmagnetic metal layer at the intermediate region are likely to be aligned with each other.

In this case, since a certain difference is also generated between the nearest interatomic distance of the {110} plane of the first magnetic layer at the intermediate region and the nearest interatomic distance of the {111} plane of the nonmagnetic metal layer, while the atoms forming the first magnetic layer and the atoms forming the nonmagnetic metal layer are being aligned with each other in the vicinity of the interface therebetween, a strain is generated in each crystal structure. That is, by generating the strain in the crystal structure of the first magnetic layer at the intermediate region, the magnetostriction constant can be increased.

For example, when formed of $Co_xFe_y$ (where $y \geq 20$ and $x+y=100$ are satisfied), the first magnetic layer of the fixed magnetic layer at the intermediate region has a bcc structure, and equivalent planes represented by a {110} plane are preferentially oriented in the direction parallel to the interface. In addition, since $Co_xFe_y$ (where $y \geq 20$ and $x+y=100$ are satisfied) forming a bcc structure has a large magnetostriction constant particularly when y is approximately 50 as compared to that of Co or $Co_xFe_y$ (where $y \leq 20$ and $x+y=100$ are satisfied) forming an fcc structure, a larger magnetoelastic effect can be obtained. Furthermore, $Co_xFe_y$ (where $y \geq 20$ and $x+y=100$ are satisfied) forming a bcc structure has a large coercive force, and hence the magnetization of the fixed magnetic layer at the intermediate region can be tightly fixed.

According to the present invention, it is preferable that the first magnetic layer of the fixed magnetic layer at least at the intermediate region have a face-centered cubic (fcc) structure in the vicinity of the interface with the nonmagnetic metal layer, in which equivalent planes represented by a {111} plane are preferentially oriented in the direction parallel to the interface described above, and have a body-centered cubic (bcc) structure in the vicinity of the interface with the interlayer, in which equivalent planes represented by a {110} plane are preferentially oriented in the direction parallel to the interface described above.

When the first magnetic layer in the vicinity of the interface with the interlayer is formed to have a bcc structure, the magnetostriction constant can be increased, and as a result, a large magnetoelastic effect can be obtained. On the other hand, when the first magnetic layer in the vicinity of the interface with the nonmagnetic metal layer is formed to have an fcc structure, the crystal orientations of the fixed magnetic layer, nonmagnetic metal layer, and the free magnetic layer are uniform at the intermediate region, and as a result, the rate (MR ratio) of change in resistance can be increased.

For example, when the first magnetic layer of the fixed magnetic layer has a composition of $Co_xFe_y$ (where $y \leq 20$ and $x+y=100$ are satisfied) or Co in the vicinity of the interface with the nonmagnetic metal layer and has a composition of $Co_xFe_y$ (where $y \geq 20$ and $x+y=100$ are satisfied) in the vicinity of the interface with the interlayer, an fcc structure can be formed in the vicinity of the interface with the nonmagnetic metal layer, in which equivalent planes represented by a {111} plane are preferentially oriented in the direction parallel to the interface, and a bcc structure can be formed in the vicinity of the interface with the interlayer, in which equivalent planes represented by a {110} plane are preferentially oriented in the direction parallel to the interface.

In addition, when the first magnetic layer of the fixed magnetic layer has a composition of $Co_xFe_y$ (where $y \geq 20$ and $x+y=100$ are satisfied) in the vicinity of the interface with the interlayer, it is preferable since the RKKY interaction between the first magnetic layer and the other magnetic layer with the interlayer provided therebetween is enhanced.

In the first magnetic layer of the fixed magnetic layer, the Fe concentration may be gradually increased from the interface with the nonmagnetic metal layer to that with the interlayer.

According to the present invention, in order to generate a strain in the crystal structure while the atoms forming the nonmagnetic metal layer and the atoms forming the first magnetic layer at the intermediate region are being aligned with each other, a value obtained when the difference in nearest interatomic distance of the nonmagnetic metal layer in an in-plane direction parallel to the interface and that of the first magnetic layer of the fixed magnetic layer at least at the intermediate region is divided by the nearest interatomic distance of the first magnetic layer is preferably in the range of from 0.05 to 0.20.

In addition, the first magnetic layer is preferably formed of a magnetic material having a positive magnetostriction constant.

A magnetic sensor in accordance with another aspect of the present invention comprises: a free magnetic layer; and two laminate provided at two sides of the free magnetic layer, the laminates each having a nonmagnetic material layer, a fixed magnetic layer in which the magnetization is fixed in a direction crossing the first direction described above, and an antiferromagnetic layer which fixes the direction of magnetization of the fixed magnetic layer. In the magnetic sensor described above, in each of the laminates, the nonmagnetic material layer, the fixed magnetic layer, and the antiferromagnetic layer are provided in that order from the free magnetic layer side, and the free magnetic layer and at least one of the laminates form one of the structures described above which can be applied to a dual spin-valve type element.

According to the present invention, vertical bias means may not be provided for orienting the magnetization of the free magnetic layer in the first direction.

When a vertical bias layer is not provided, the structure of the entire element can be simplified, and in addition, an element having a smaller thickness can also be realized.

BRIEF DESCRIPTION OF THE DRAWINGS

FIG. 20 is a schematic view showing the structure of a magnetic sensor practically used for an experiment according to a comparative example;

DESCRIPTION OF THE PREFERRED EMBODIMENTS

Figure 1:
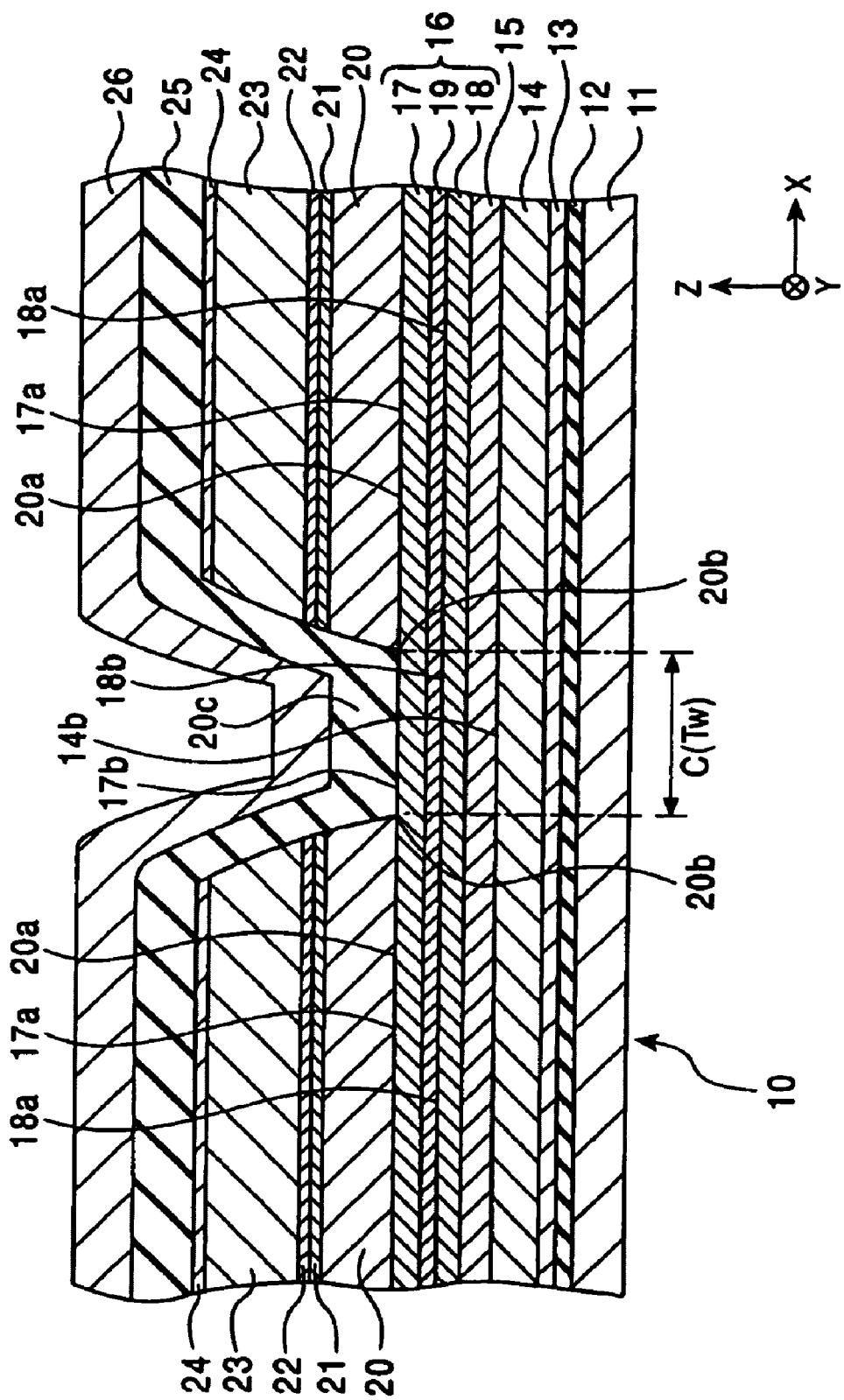
FIG. 1 is a partial cross-sectional view of the structure of a magnetic sensor according to a first embodiment of the present invention, the structure being viewed from a face opposing a recording medium.

FIG. 1 is a partial cross-sectional view showing the structure of a magnetic sensor (spin-valve type thin film magnetic element) according to a first embodiment of the present invention, the structure being viewed from a face opposing a recording medium. In a magnetic sensor 10 shown in FIG. 1, a free magnetic layer 14 is formed at the lower side of antiferromagnetic layers 20.

In the magnetic sensor 10, on the upper surface of a lower shield layer (substrate) 11 made of a magnetic material such as a NiFe alloy or sendust, a lower gap layer 12 is formed from an insulating material such as $Al_2O_3$, and on the lower gap layer 12, a seed layer 13 is formed from a NiFeCr alloy or Cr.

On the seed layer 13, the free magnetic layer 14 is formed. The free magnetic layer 14 is formed of a magnetic material such as a NiFe alloy or a CoFe alloy.

The free magnetic layer 14 is placed in a single domain state in the track width direction so that the magnetization thereof is likely to rotate by an external magnetic field coming along a Y direction in the figure.

On the free magnetic layer 14, a nonmagnetic material layer 15 is formed. The nonmagnetic material layer 15 prevents magnetic coupling between a fixed magnetic layer 16 and the free magnetic layer 14, allows a sense current to flow primarily therethrough, and is preferably formed of a nonmagnetic material having conductivity, such as copper (Cu), chromium (Cr), gold (Au), or silver (Ag). In particular, Cu is preferably used.

On the nonmagnetic material layer 15, the fixed magnetic layer 16 is formed. In the embodiment shown in FIG. 1, the fixed magnetic layer 16 has a synthetic ferrimagnetic structure. The fixed magnetic layer 16 has a three-layered structure composed of a first magnetic layer 17 in contact with the antiferromagnetic layers 20, a second magnetic layer 18 facing the first magnetic layer 17 in the thickness direction (Z direction in the figure), and an interlayer 19 imposed between the first magnetic layer 17 and the second magnetic layer 18.

The first and the second magnetic layers 17 and 18 are each formed of a magnetic material such as a NiFe alloy, Co, a CoNiFe alloy, a CoFe alloy, or a CoNi alloy. For example, the first magnetic layer 17 and the second magnetic layer 18 are formed of the same material. In addition, each of the magnetic layers 17 and 18 may have a single-layered structure or a multilayer structure.

In addition, the interlayer 19 is formed of a nonmagnetic material selected from the group consisting of Ru, Rh, Ir, Cr, rhenium (Re), Cu, and an alloy thereof. In particular, Ru is preferably used.

The length of each of the free magnetic layer 14, the nonmagnetic material layer 15, and the fixed magnetic layer 16 in a first longitudinal direction (X direction in the figure, referred to as "track width direction" in some cases) is formed larger than the width thereof in a second direction, that is, in a height direction (Y direction in the figure), the second direction being perpendicular to the first direction and along the plane parallel to the X-Y plane (direction along the film surface). Accordingly, the free magnetic layer 14 has shape anisotropy, and as a result, the magnetization inside the free magnetic layer 14 is preferentially oriented in the track width direction. The "shape anisotropy" in the present invention means that the magnetization of the free magnetic layer 14 having a predetermined length is oriented in the longitudinal direction described above. For forming the free magnetic layer 14 so as to have the shape anisotropy, the length of the free magnetic layer 14 between the two end portions thereof in the track width direction is preferably 1 μm or more. In addition, for easily orienting the magnetization of the free magnetic layer 14 more appropriately in the first direction described above, induced magnetic anisotropy is also preferably imparted thereto in addition to the shape anisotropy described above, and hence the free magnetic layer 14 is preferably formed in a magnetic field.

In addition, when an element, such as Pt, carbon (C), boron (B), and a rare earth element, which can change the free magnetic layer 14 into a hard magnetic layer, is ion-planted only into the side portions of the free magnetic layer 14 in the track width direction, the two side portions of the free magnetic layer 14 become hard magnetic layers. (The "two side portions" in the present invention indicate two side regions located on two sides of an intermediate region 20c in the track width direction as shown in FIG. 1, and hereinafter the two side portions indicate the same regions as described above.) By magnetizing this hard magnetic layer described above, the magnetization of the free magnetic layer 14 may be stabilized.

In the magnetic sensor 10 described above, the antiferromagnetic layers 20 are separately formed on two side portions 17a of the first magnetic layer 17 in the first direction with the intermediate region 20c provided therebetween. The antiferromagnetic layer 20 is not formed on a central portion 17b of the first magnetic layer 17. The antiferromagnetic layer 20 is preferably formed of a PtMn alloy, an X—Mn alloy (where X is at least one selected from the group consisting of Pd, Ir, Rh, Ru, Os, Ni, and Fe), or a Pt—Mn—X' alloy (where X' is at least one selected from the group consisting of Pd, Ir, Rh, Ru, Au, Ag, Os, Cr, Ni, argon (Ar), neon (Ne), xenon (Xe), and krypton (Kr)) and, in addition, an antiferromagnetic material having a blocking temperature lower than that of a PtMn alloy may also be used. The thickness of the antiferromagnetic layer 20 is, for example, approximately 80 to 300 Å.

In order to generate an exchange coupling magnetic field between the antiferromagnetic layers 20 and the first magnetic layer 17, the antiferromagnetic layers 20 are heat-treated in a magnetic field. Before the heat treatment, the antiferromagnetic layers 20 each have an irregular crystal structure; however, after the heat treatment, at least part of each antiferromagnetic layer 20 has a regular crystal structure. For example, as for an X—Mn alloy, the arrangement of X atoms and Mn atoms forms an irregular face-centered cubic structure before the heat treatment; however, after the heat treatment, in at least part of the antiferromagnetic layer 20, the X atoms and the Mn atoms are arranged regularly to form an L10 type (CuAuI type) face-centered cubic crystal structure.

When heat treatment in a magnetic field is performed for the antiferromagnetic layers 20, at least part of the irregular lattice structure is transformed into the regular lattice structure as described above, exchange coupling magnetic fields are generated between the antiferromagnetic layers 20 and the respective two side portions 17a of the first magnetic layer 17, and as a result, the magnetization of the first magnetic layer 17 is fixed in the second direction (Y direction in the figure). In the embodiment shown in FIG. 1, since the fixed magnetic layer 16 has a synthetic ferrimagnetic structure composed of the two magnetic layers 17 and 18 and the interlayer 19 provided therebetween, an antiparallel coupling magnetic field by the RKKY interaction between the first magnetic layer 17 and the second magnetic layer 18 is generated, and as a result, the magnetizations of two side portions 18a of the second magnetic layer 18 are each fixed in the direction opposite to the Y direction in the figure. In addition, between the central portion 17b of the first magnetic layer 17 and a central portion 18b of the second magnetic layer 18, an antiparallel coupling magnetic field is also generated by the RKKY interaction, and the magnetizations of the central portions 17b and 18b of the first and the second magnetic layers 17 and 18, respectively, are fixed in an antiparallel state as are the magnetization directions of the two side portions 17a and 18a.

On each of the antiferromagnetic layers 20, a stop layer 21 is formed from Cr or the like, and on the stop layer 21, a protection layer 22 is formed from Ta or the like. On the protection layer 22, an electrode layer 23 is formed from a nonmagnetic conductive material such as Au, Pd, Cr, Rh, Ru, Ta, and tungsten (W), and on the electrode layer 23 described above, a protection layer 24 is further formed from Ta or the like.

Over the protection layers 24 and the first magnetic layer 17 of the fixed magnetic layer 16, which is exposed at the intermediate region 20c formed between the antiferromagnetic layers 20, an upper gap layer 25 of an insulating material is formed, and an upper shield layer 26 of a magnetic material is formed over the upper gap layer 25.

In the embodiment shown in FIG. 1, the distance between one side end 20b of a contact face 20a between one antiferromagnetic layer 20 and the first magnetic layer 17 and the other end side 20b of a contact face 20a between the other antiferromagnetic layer 20 and the first magnetic layer 17, that is, a distance C between the two antiferromagnetic layers 20 disposed in the X direction in the figure, is a practical region for sensing an external magnetic field. The width dimension of this sensing region in the first direction is called a track width (Tw).

Characteristic portions of the structure of the magnetic sensor shown in FIG. 1 will be described. In the embodiment shown in FIG. 1, the fixed magnetic layer 16 has a three-layered structure composed of the first magnetic layer 17, the second magnetic layer 18, and the interlayer 19 provided therebetween. Since the antiparallel coupling magnetic field is generated between the first magnetic layer 17 and the second magnetic layer 18 by the RKKY interaction, the magnetizations of the two magnetic layers 17 and 18 are placed in an antiparallel state.

The antiferromagnetic layers 20 are separately provided on the two side portions 17a of the first magnetic layer 17 with the intermediate region 20c provided therebetween and are not provided on the central portion 17b of the first magnetic layer 17. Hence, the exchange coupling magnetic fields are generated only between the antiferromagnetic layers 20 and the respective two side portions 17a of the first magnetic layer 17 and are not generated between the antiferromagnetic layers 20 and the central portion 17b of the first magnetic layer 17. Accordingly, while the magnetizations of the two side portions 17a of the first magnetic layer 17 and those of the respective two side portions 18a of the second magnetic layer 18 are maintained in an antiparallel state by the exchange coupling magnetic fields, the RKKY interaction, and the like, they are fixed in the direction parallel to the second direction (Y direction in the figure).

In addition, it is confirmed by experiments described later that while the magnetizations of the first magnetic layer 17 and the second magnetic layer 18 of the fixed magnetic layer 16 at the central portions 17b and 18b are maintained in an antiparallel state by a bias magnetic field generated by an exchange interaction between individual magnetic layers and the RKKY interaction described above, they are fixed in the direction parallel to the second direction. Accordingly, in the embodiment shown in FIG. 1, the magnetization of the fixed magnetic layer 16 can be appropriately fixed.

That is, since the antiferromagnetic layers 20 formed on the fixed magnetic layer 16 are separately provided on the two side portions thereof in the first direction with the intermediate region 20c provided therebetween, the exchange coupling magnetic fields are generated only at the two side portion described above; however, the fixed magnetic layer 16 has a synthetic ferrimagnetic structure as shown in FIG. 1, the magnetization of the entire fixed magnetic layer 16 can be appropriately fixed in the second direction.

In addition, since the antiferromagnetic layer 20 is not provided on the central portion 17b of the first magnetic layer 17, a sense current from the electrode layer 23 flowing primarily through the nonmagnetic material layer 15 is unlikely to be shunted to the antiferromagnetic layer 20, and hence the shunt loss can be decreased, thereby improving the reproduction output.

In addition, since the antiferromagnetic layer 20 is not provided on the central portion 17b of the first magnetic layer 17, the distance between the lower shield layer 11 and the upper shield layer 26 is decreased at an element central portion in the thickness direction (Z direction in the figure), and hence so-called narrower gap can be realized. Since the central portion 14b of the free magnetic layer 14 is a region having reproduction sensitivity, when the gap length at the element central portion can be decreased, increase in pulse width (PW50) of a reproduction waveform and decrease in resolution can be appropriately prevented, a magnetic sensor which can appropriately meet the trend toward higher recording density can be manufactured.

Furthermore, since the antiferromagnetic layer 20 is not provided on the central portion 17b of the first magnetic layer 17, magnetic electrostatic discharge (ESD) becomes unlikely to occur at the element central portion of the fixed magnetic layer 16.

In a magnetic sensor having an antiferromagnetic layer provided on a fixed magnetic layer, when a transient current flows from an electrode layer by electrostatic discharge (ESD), heat may be generated in the element in some cases so that the temperature is increased to that close to a blocking temperature of the antiferromagnetic layer. In the case described above, when the antiferromagnetic layer generating exchange coupling is present at the central portion of the fixed magnetic layer in the first direction, since the exchange coupling with the fixed magnetic layer at which this antiferromagnetic layer is present becomes unstable, the direction of magnetization of the fixed magnetic layer will be moved, and as a result, magnetic electrostatic damage is liable to occur.

In particular, when the fixed magnetic layer is a single layer, the magnetization thereof is liable to be moved. However, even in the fixed magnetic layer having a synthetic ferrimagnetic structure in which a first magnetic layer and a second magnetic layer are magnetized in an antiparallel state by the RKKY coupling, when the first magnetic layer is formed in contact with an antiferromagnetic layer, the temperature of the antiferromagnetic layer is increased to a blocking temperature or more, and as a result, the exchange coupling between the antiferromagnetic layer and the first magnetic layer becomes unstable. When a magnetic field is generated by a current in the case described above, the direction of magnetization of the first magnetic layer in contact with the antiferromagnetic layer is rotated, and hence magnetic electrostatic damage may occur in some cases.

On the other hand, as is the case of the present invention, when an antiferromagnetic layer generating exchange coupling is not present on the central portion 17b of the first magnetic layer 17 of the fixed magnetic layer 16 in the first direction, the magnetization inversion in the first magnetic layer 17 will not occur (even when the magnetization inversion occurs, since the direction of the exchange coupling at each of the two side portions 17a of the first magnetic layer 17 will not be changed, when the flow of a transient current is stopped, the direction of magnetization of the first magnetic layer 17 returns to the original direction), and the magnetization of the fixed magnetic layer 16 can be stably fixed, so that resistance against magnetic electrostatic damage can be enhanced.

As described above, according to the structure of the magnetic sensor 10 shown in FIG. 1, since the magnetization of the fixed magnetic layer 16 can be appropriately fixed in the second direction, and the improvement in reproduction output, the trend toward narrower gap, and the suppression of electrostatic damage can be realized, a magnetic sensor can be provided which is capable of appropriately satisfying the trend toward the higher recording density.

In addition, in the magnetic sensor 10 described above, the free magnetic layer 14 has the shape anisotropy, and the magnetization of the free magnetic layer 14 is oriented in the track width direction. Accordingly, it is not necessary to provide means for orienting the magnetization of the free magnetic layer 14 in the track width direction, such as a permanent magnetic layer provided at the side of the free magnetic layer 14, and hence the structure and the manufacturing method thereof can be simplified.

As the magnetic sensor 10 shown in FIG. 1, the multilayer structure is described by way of example in which the free magnetic layer 14, the nonmagnetic material layer 15, the fixed magnetic layer 16, and the antiferromagnetic layers 20 are provided in that order from the bottom. However, the present invention is not limited thereto, and for example, a multilayer structure may be used in which antiferromagnetic layers, a fixed magnetic layer, a nonmagnetic material layer, and a free magnetic layer are provided in that order from the bottom.

Figure 2:
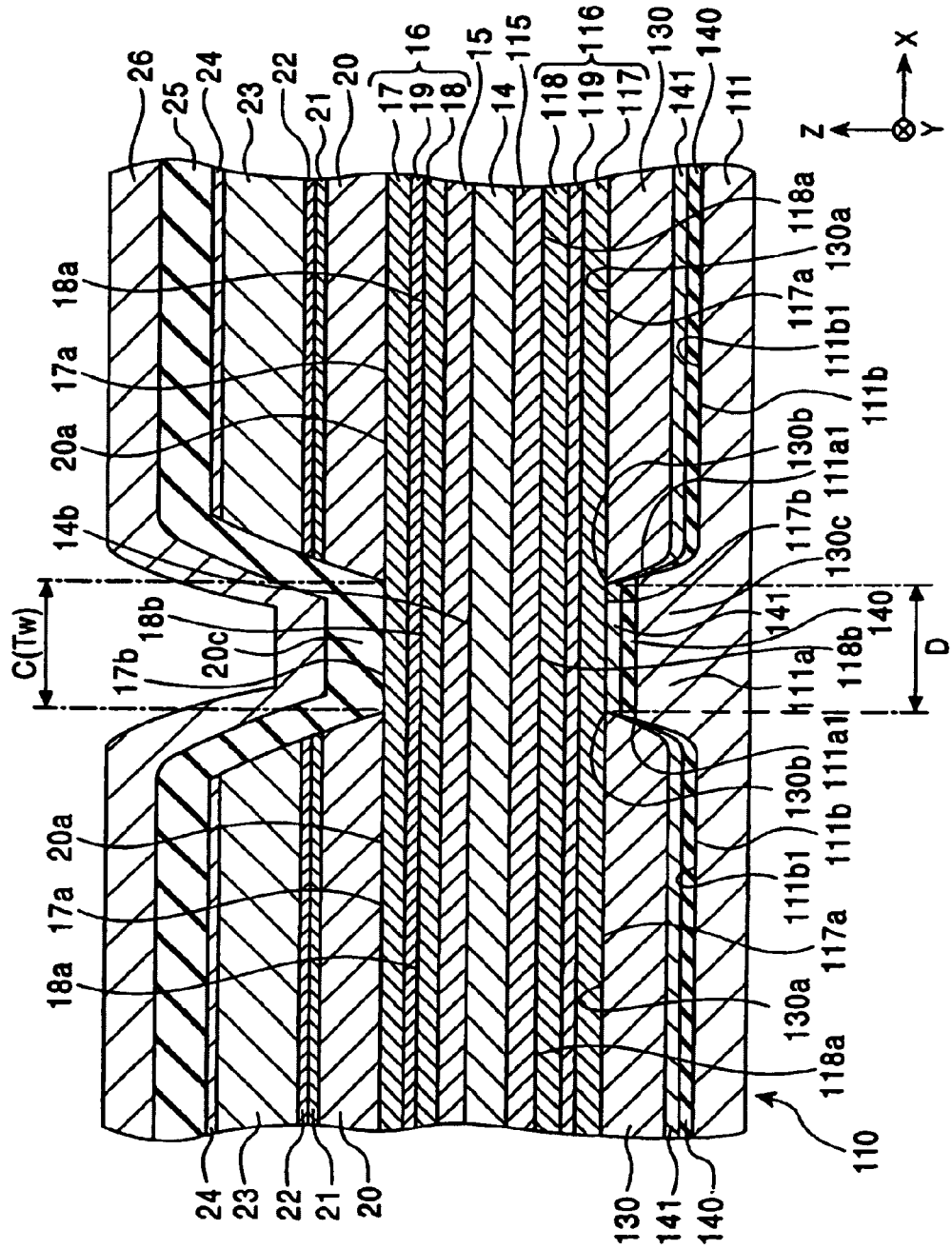
FIG. 2 is a partial cross-sectional view of the structure of a magnetic sensor according to a second embodiment of the present invention, the structure being viewed from a face opposing a recording medium.

FIG. 2 is a partial cross-sectional view showing the structure of a magnetic sensor (spin-valve type thin film magnetic element) according to a second embodiment of the present invention, the structure being viewed from the face opposing a recording medium. A magnetic sensor 110 shown in FIG. 2 is a sensor in which first antiferromagnetic layers 20 are provided above the free magnetic layer 14, and second antiferromagnetic layers 130 are provided under the free magnetic layer 14.

The same reference numerals of the constituent elements in FIG. 1 designate the same elements in the magnetic sensor 110 shown in FIG. 2, and description thereof will be omitted.

In the magnetic sensor 110, between the free magnetic layer 14 and a lower shield layer 111, the second antiferromagnetic layers 130, a second fixed magnetic layer 116, and a second nonmagnetic material layer 115 are further formed in that order from the bottom.

The lower shield layer 111 is formed of a magnetic material such as a NiFe alloy or sendust. A protruding portion 111a protruding in the thickness direction (Z direction in the figure) is provided for the lower shield layer 111 at a central portion in the track width direction, and at the two sides of the protruding portion 111a in the track width direction, recesses 111b are provided.

As shown in FIG. 2, on the upper surface of the protruding portion 111a of the lower shield layer 111, a lower gap layer 140 composed of an insulating material such as $Al_2O_3$ is formed, and the lower gap layer 140 is also formed over the two side surfaces 111a1 of the protruding portion 111a in the track width direction to the upper surfaces 111b1 of the recesses 111b.

As shown in FIG. 2, on the lower gap layer 140 provided over the recesses 111b of the lower shield layer 111 to the protruding portion 111a thereof, a seed layer 141 composed of a NiFe alloy, a NiFeCr alloy, or Cr is formed.

On the seed layer 141, the second antiferromagnetic layers 130 are formed. The second anti ferromagnetic layers 130 are formed so as to be primarily filled in the recess 111b of the lower shield layer 111. The second antiferromagnetic layers 130 each have the structure equivalent to that of the antiferromagnetic layer 20 described above and is formed, for example, of an antiferromagnetic material such as a PtMn alloy.

On the second antiferromagnetic layers 130, the second fixed magnetic layer 116 is formed. The second fixed magnetic layer 116 has a synthetic ferrimagnetic structure as is the fixed magnetic layer 16. The fixed magnetic layer 116 has a three-layered structure composed of a first magnetic layer 117 in contact with the second antiferromagnetic layers 130, a second magnetic layer 118 facing the first magnetic layer 117 in the thickness direction (Z direction in the figure), and an interlayer 119 provided between the first magnetic layer 117 and the second magnetic layer 118.

The first and the second magnetic layers 117 and 118 and the interlayer 119 are formed of the same materials for those of the first and the second magnetic layers 17 and 18 and the interlayer 19, respectively. In addition, the first and the second magnetic layers 117 and 118 forming the second fixed magnetic layer 116 may have a single layer structure or a multilayer structure composed of magnetic layers.

The second antiferromagnetic layer 130 is not formed on the seed layer 141 provided above the protruding portion 111a of the lower shield layer 111, and the upper surface of the seed layer 141 formed above the protruding portion 111a is in contact with the second fixed magnetic layer 116. The second antiferromagnetic layers 130 are separately provided under the two side portions 117a of the first magnetic layer 117 of the second fixed magnetic layer 116 with an intermediate region 130c provided therebetween. Only between the second antiferromagnetic layers 130 and the respective side portions 117a of the first magnetic layer 117 of the second fixed magnetic layer 116, exchange coupling magnetic fields are generated; however, since the fixed magnetic layer 116 has a synthetic ferrimagnetic structure, the magnetization of the entire second fixed magnetic layer 116 can be appropriately fixed in the second direction.

In order to generate an exchange coupling magnetic field between the second antiferromagnetic layers 130 and the first magnetic layer 117, the second antiferromagnetic layers 130 are heat-treated in a magnetic field. The second antiferromagnetic layers 130 each have an irregular crystal structure before the heat treatment; however, after the heat treatment, at least part of each of the second antiferromagnetic layers 130 has a regular crystal structure. For example, an X—Mn alloy has a crystal structure before the heat treatment in which X atoms and Mn atoms are arranged to form an irregular face-centered cubic crystal; however, after the heat treatment, at least part of the alloy described above is transformed so that the X atoms and the Mn atoms are regularly arranged to form an L10 type (CuAuI type) face-centered tetragonal crystal structure.

When heat treatment is performed in a magnetic field, at least part of the irregular crystal structure of each second antiferromagnetic layer 130 is transformed into the regular crystal structure as described above, exchange coupling magnetic fields are generated between the second antiferromagnetic layers 130 and the respective two side portions 117a of the first magnetic layer 117 of the second fixed magnetic layer 116, and as a result, the magnetization of the first magnetic layer 117 is fixed in the second direction. In the embodiment shown in FIG. 2, since the second fixed magnetic layer 116 has a synthetic ferrimagnetic structure composed of the two magnetic layers 117 and 118 and the interlayer 119 provided therebetween, an antiparallel coupling magnetic field is generated by the RKKY interaction between the first magnetic layer 117 and the second magnetic layer 118, and the magnetization of each of the two side portions 118a of the second magnetic layer 118 is fixed in the direction opposite to the second direction. In addition, between the central portions 117b and 118b of the first magnetic layer 117 and the second magnetic layer 118, respectively, an antiparallel coupling magnetic filed is also generated, and the magnetizations of the central portions 117b and 118b of the first magnetic layer 117 and the second magnetic layer 118, respectively, are fixed in an antiparallel state as those of the two side portions 117a and 118a.

Between the second fixed magnetic layer 116 and the free magnetic layer 14, a second nonmagnetic material layer 115 is formed. The second nonmagnetic material layer 115 is formed of the same material as that for the nonmagnetic material layer 15 and is a layer which prevents magnetic coupling between the second fixed magnetic layer 116 and the free magnetic layer 14 and which allows a sense current to flow primarily therethrough.

The length of each of the free magnetic layer 14, the first and the second nonmagnetic material layers 15 and 115, and the first and the second fixed magnetic layers 16 and 116 in the first longitudinal direction is formed larger than the width thereof in the second direction. Accordingly, the free magnetic layer 14 has the shape anisotropy, and the magnetization of the free magnetic layer 14 is preferentially oriented in the track width direction. In order to form the free magnetic layer 14 so as to have the shape anisotropy, the length of the free magnetic layer 14 between the two end portions thereof in the track width direction is preferably 1 μm or more. In addition, in order to further stabilize the magnetization of the free magnetic layer 14 in the track width direction, induced magnetic anisotropy is also preferably imparted thereto in addition to the shape anisotropy described above, and hence the free magnetic layer 14 is preferably formed in a magnetic field.

In the embodiment shown in FIG. 2, the distance from one end 130b of a contact surface 130a between one of the second antiferromagnetic layers 130 and the first magnetic layer 117 to the other side 130b of the other contact surface 130a between the other second antiferromagnetic layer 130 and the first magnetic layer 117, that is, a distance D between the antiferromagnetic layers 130 provided in the X direction, is formed to be equivalent to or smaller than the track width (Tw).

According to the magnetic sensor 110, the distance (so-called gap length) between the lower shield layer 111 and the upper shield layer 26 can be decreased in the thickness direction, and the trend toward the narrower gap can be satisfied.

Figure 3:
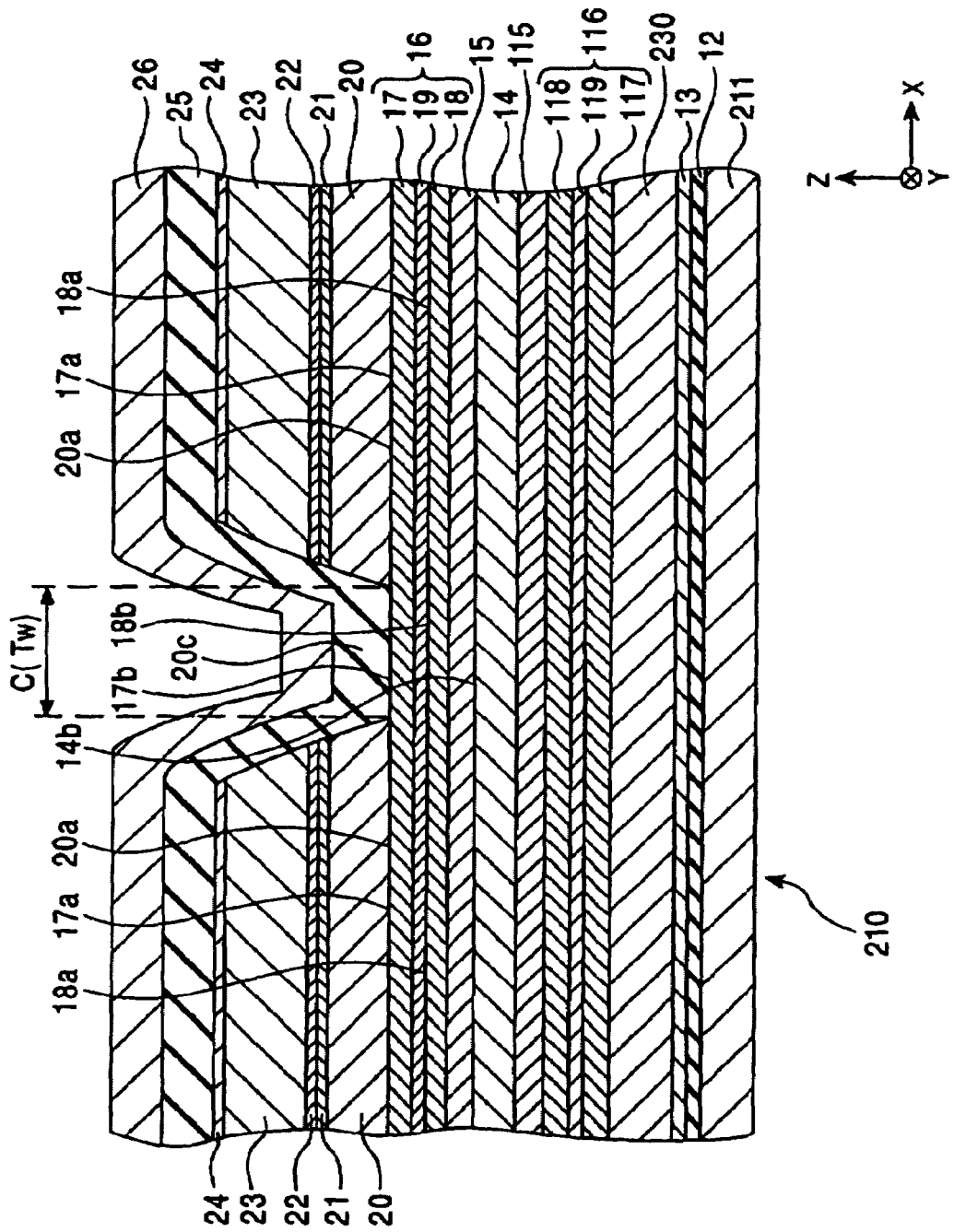
FIG. 3 is a partial cross-sectional view of the structure of a magnetic sensor according to a third embodiment of the present invention, the structure being viewed from a face opposing a recording medium.

FIG. 3 is a partial cross-sectional view showing the structure of a magnetic sensor (spin-valve type thin film magnetic element) according to a third embodiment of the present invention, the structure being viewed from the face opposing a recording medium. As is the magnetic sensor 110 shown in FIG. 2, a magnetic sensor 210 shown in FIG. 3 is a sensor in which the first antiferromagnetic layers 20 are provided above the free magnetic layer 14, and a second antiferromagnetic layer 230 is provided under the free magnetic layer 14.

Since the magnetic sensor 210 shown in FIG. 3 has the structure similar to each of the magnetic sensors 10 and 110 shown in FIGS. 1 and 2, the same reference numerals of the constituent elements of the magnetic sensors 10 and 110 designate the same constituent elements of the magnetic sensor 210, and description thereof will be omitted.

In the magnetic sensor 210 shown in FIG. 3, no recess is formed in a lower shield layer 211, and the lower shield layer 211 has a flat upper surface. In addition, on the lower shied layer 211, the lower gap layer 12 and the seed layer 13 are formed in that order, and the second antiferromagnetic layer 230 is formed thereon.

The second antiferromagnetic layer 230 has a uniform film thickness and is extended in the first direction.

In order to generate an exchange coupling magnetic field between the second antiferromagnetic layer 230 and the first magnetic layer 117, heat treatment is performed in a magnetic field. The second antiferromagnetic layer 230 has an irregular crystal structure before the heat treatment; however, after the heat treatment, at least part of the second antiferromagnetic layer 230 is transformed to a regular crystal structure. For example, before the heat treatment, an X—Mn alloy has a crystal structure in which X atoms and Mn atoms are arranged to form an irregular face-centered cubic crystal; however, after the heat treatment, at least part of the alloy described above is transformed so that the X atoms and the Mn atoms are regularly arranged to form an L10 type (CuAuI type) face-centered tetragonal crystal structure.

When heat treatment is performed in a magnetic field, an exchange coupling magnetic field is generated in the entire region between the second antiferromagnetic layer 230 and the first magnetic layer 117 of the second fixed magnetic layer 116 in the track width direction, and as a result, the magnetization of the first magnetic layer 117 is fixed in the second direction. In the embodiment shown in FIG. 3, since the fixed magnetic layer 116 has a synthetic ferrimagnetic structure composed of the two magnetic layers 117 and 118 and the interlayer 119 provided therebetween, an antiparallel coupling magnetic field is generated between the first magnetic layer 117 and the second magnetic layer 118 by the RKKY interaction, and hence the magnetization of the second magnetic layer 118 is fixed in the direction opposite to the second direction.

As are the magnetic sensors 10 and 110, in the magnetic sensor 210, the length of each of the free magnetic layer 14, the first and the second nonmagnetic material layers 15 and 115, and the first and the second fixed magnetic layers 16 and 116 in the first longitudinal direction is formed larger than the width thereof in the second direction. Accordingly, the free magnetic layer 14 has the shape anisotropy, and hence the magnetization of the free magnetic layer 14 is preferentially oriented in the track width direction. In order to form the free magnetic layer 14 so as to have the shape anisotropy, the length of the free magnetic layer 14 between the two end portions thereof in the track width direction is preferably 1 µm or more. In addition, in order to further stabilize the magnetization of the free magnetic layer 14 in the track width direction, induced magnetic anisotropy is also preferably imparted thereto in addition to the shape anisotropy described above, and hence the free magnetic layer 14 is preferably formed in a magnetic field.

In the magnetic sensor 210, since the second antiferromagnetic layer 230 having a uniform thickness is extended over the seed layer 13 in the first direction, the element structure can be simplified, and as a result, the manufacturing thereof can also be easily performed.

The magnetic sensors 10, 110, and 210 shown in FIGS. 1 to 3 each have a CIP (current in the plane) type structure in which the electrode layers 23 are provided on two element side portions and a sense current flows between the electrode layers 23 in the direction parallel to the surfaces of the individual layers forming the multilayer structure. However, the present invention may also be applied to a CPP (current perpendicular to the plane) type structure in which a sense current from an electrode layer flows in the direction parallel to the thickness direction of the multilayer film. The embodiments of the CPP type structure are shown in FIGS. 4 to 6.

Figure 4:
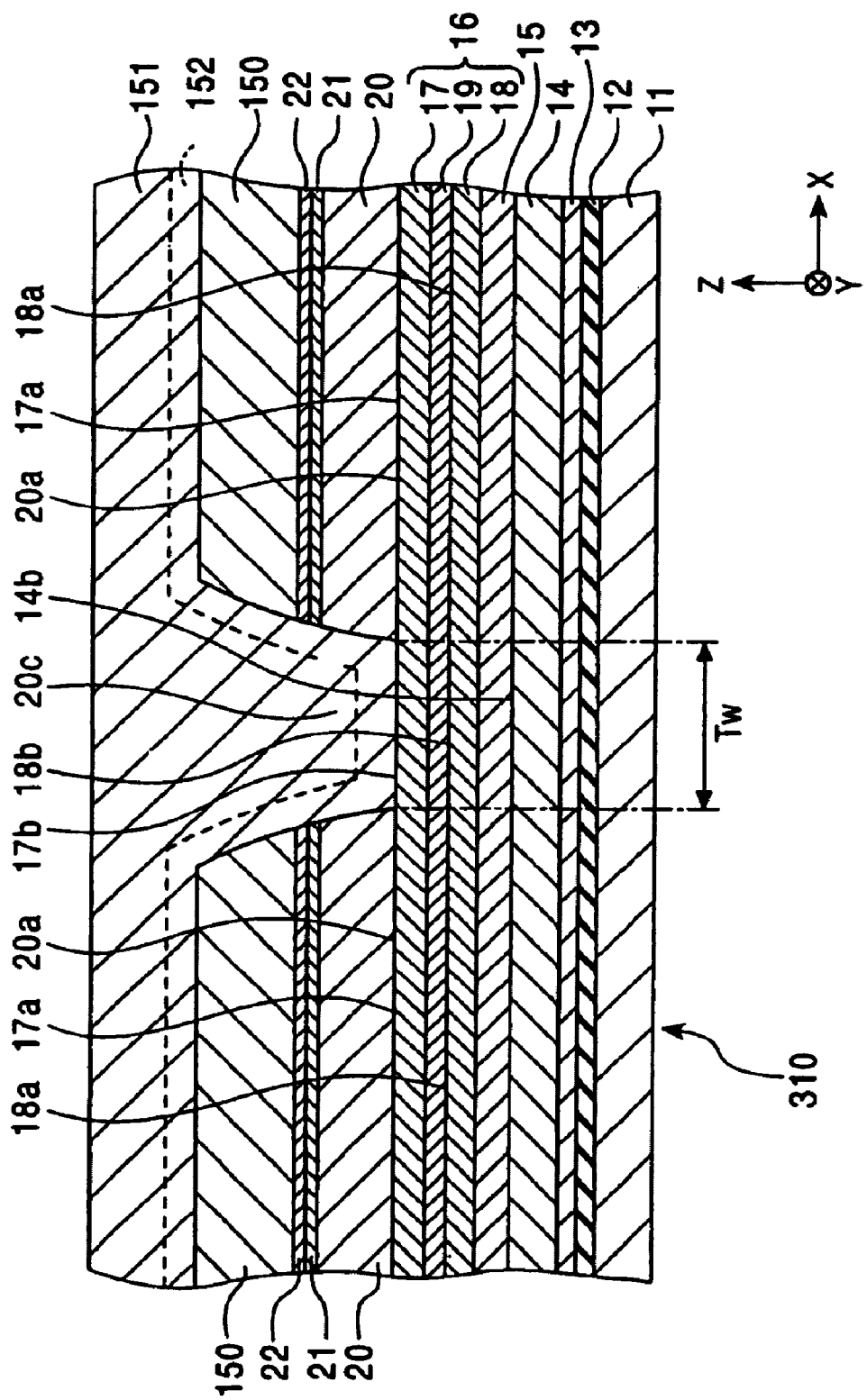
FIG. 4 is a partial cross-sectional view of the structure of a magnetic sensor according to a fourth embodiment of the present invention, the structure being viewed from a face opposing a recording medium.
Figure 5:
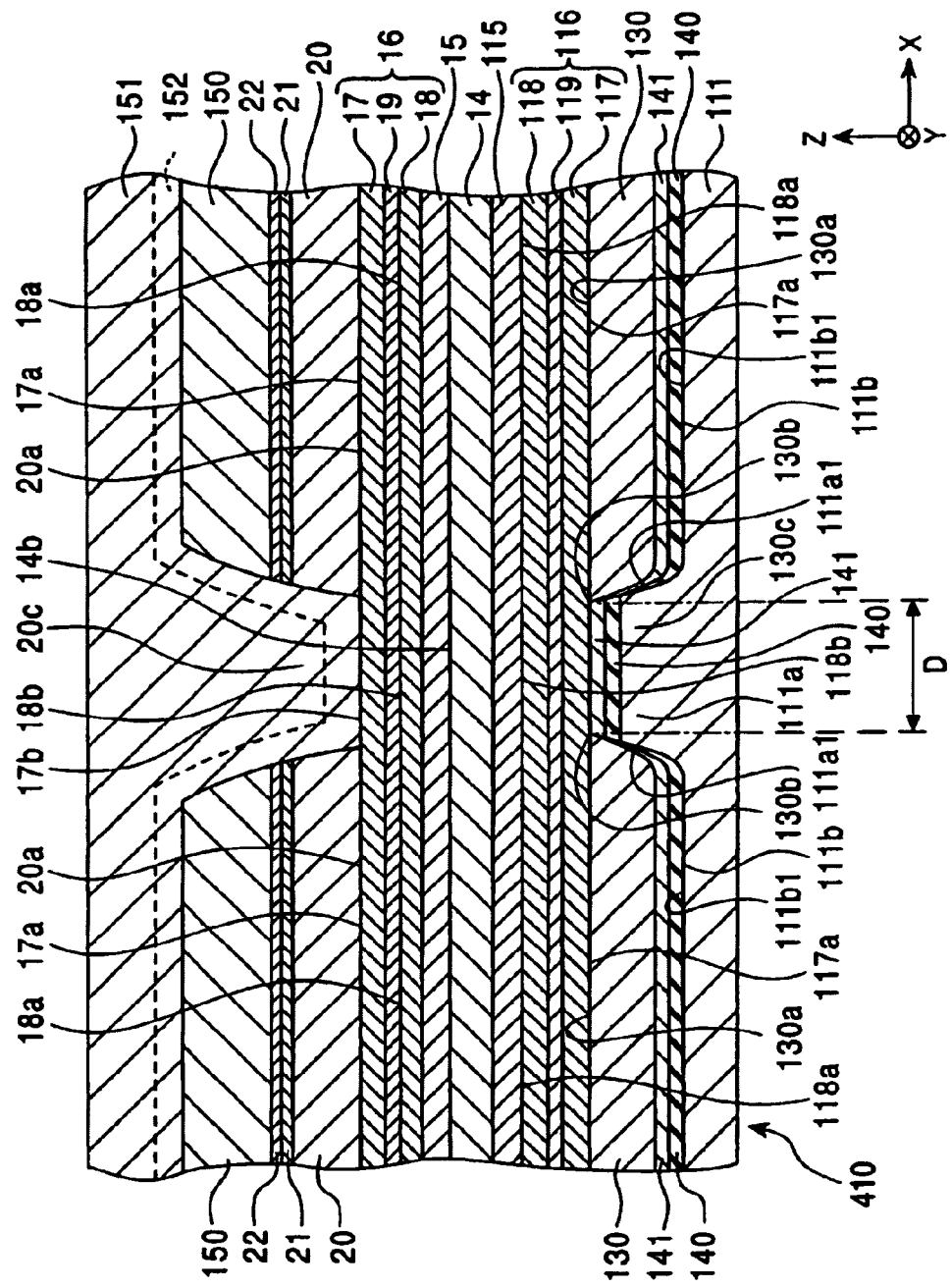
FIG. 5 is a partial cross-sectional view of the structure of a magnetic sensor according to a fifth embodiment of the present invention, the structure being viewed from a face opposing a recording medium.
Figure 6:
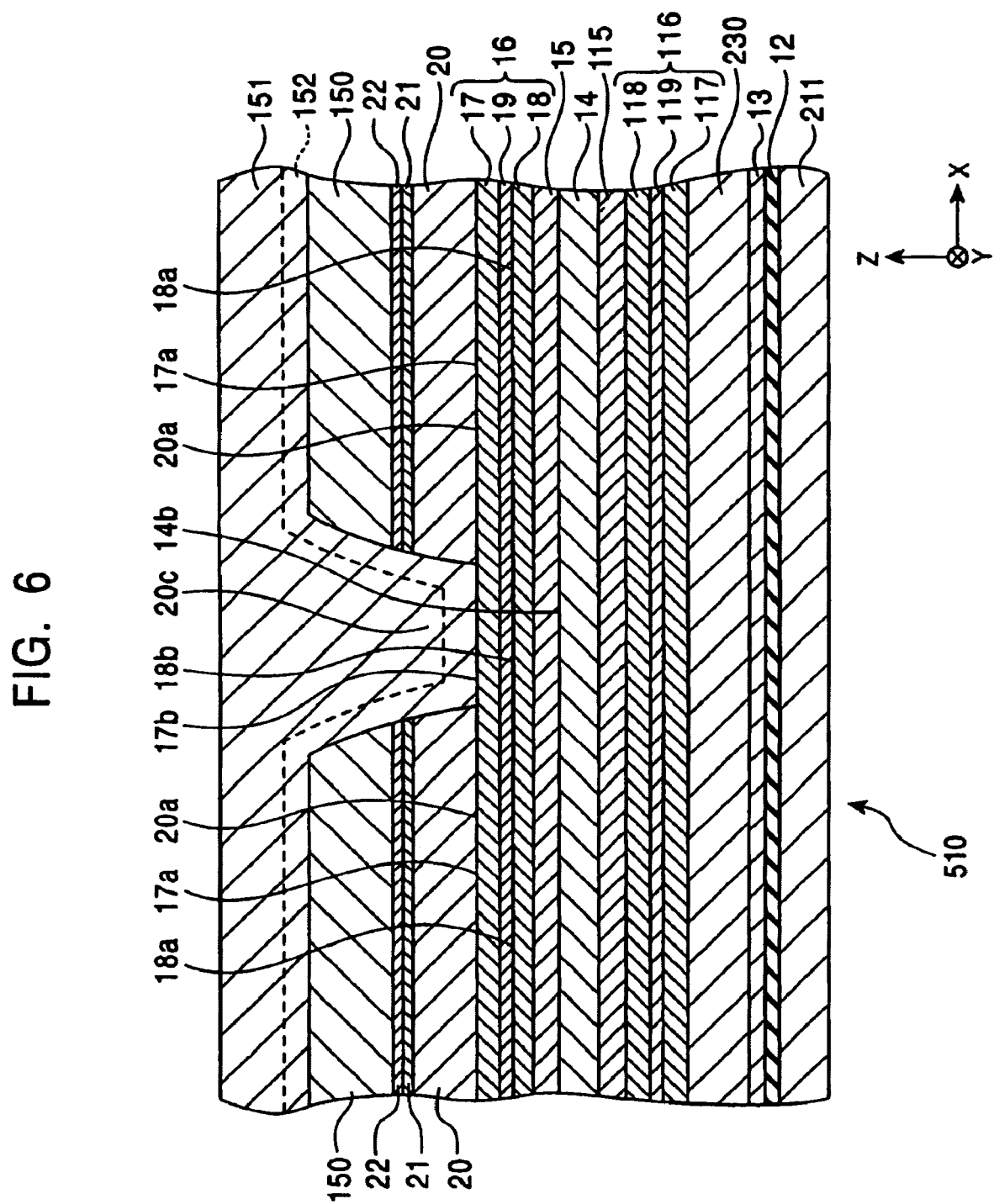
FIG. 6 is a partial cross-sectional view of the structure of a magnetic sensor according to a sixth embodiment of the present invention, the structure being viewed from a face opposing a recording medium.

FIG. 4 shows a magnetic sensor 310 according to a fourth embodiment in which the magnetic sensor 10 shown in FIG. 1 is applied to a CPP type structure, FIG. 5 shows a magnetic sensor 410 according to a fifth embodiment in which the magnetic sensor 110 shown in FIG. 2 is applied to a CPP type structure, and FIG. 6 shows a magnetic sensor 510 according to a sixth embodiment in which the magnetic sensor 210 shown in FIG. 3 is applied to a CPP type structure.

The same reference numerals of the constituent elements of the magnetic sensor 10, 110, and 210 shown in FIGS. 1 to 3 designate the same constituent elements in FIGS. 4 to 6, and description thereof will be omitted.

In the magnetic sensors 310, 410, and 510 shown in FIGS. 4 to 6, each of the lower shield layers 11, 111, and 211 is formed of a magnetic material such as a NiFe alloy and serves as a lower electrode layer in addition to the shielding function.

In the embodiments shown in FIGS. 4 to 6, insulating layers 150 are formed at the places at which the electrode layers 23 are provided in FIGS. 1 to 3. In addition, an upper shield layer 151 is formed over the insulating layers 150 to the first magnetic layer 17 of the fixed magnetic layer 16 exposed at the intermediate region 20c which is formed between the antiferromagnetic layers 20. The upper shield layer 151 is formed of a magnetic material such as a NiFe alloy and also serves as an upper electrode layer in addition to the shielding function.

In addition, the upper shield layer 151 must be magnetically isolated from the first magnetic layer 17, and as shown by dotted lines in FIGS. 4 to 6, an upper gap layer 152, that is, a nonmagnetic conductive layer, is preferably provided.

In the embodiments shown in FIGS. 4 to 6, by the insulating layers 150 provided above the first magnetic layer 17, a sense current from the upper shield layer 151 can be prevented from being shunted to the two sides in the track width direction, and as a result, a magnetic sensor having a large reproduction output can be manufactured.

The nonmagnetic conductive layer 15 shown in FIGS. 4 to 6 is formed, for example, of Cu; however, in a tunnel type magnetoresistive element (TMR element) using the principle of a spin tunnel effect, the nonmagnetic conductive layer 15 is formed, for example, of an insulating material such as $Al_2O_3$.

In the magnetic sensors 10, 110, 210, 310, 410, and 510 described with reference to FIGS. 1 to 6, the structures are described by way of example in which the antiferromagnetic layers 20 and 130 formed on the two side portions 17a of the first magnetic layer 17 and under the two side portions 117a thereof, respectively, are provided separately with the space provided therebetween and in which the antiferromagnetic layers 20 and 130 are not provided on the central portion 17b of the first magnetic layer 17 and under the central portion 117b thereof, respectively. However, the present invention is not limited thereto, at the intermediate region 20c described above, nonmagnetic metal layers having the same compositions as those of the antiferromagnetic layers 20 and 130 may be provided. However, in this case, the nonmagnetic metal layers having the same compositions as those of the antiferromagnetic layers 20 and 130 are preferably formed to have small thicknesses as compared to those of the antiferromagnetic layers 20 and 130. In this case, the nonmagnetic metal layers having the same compositions as those of the antiferromagnetic layers 20 and 130 are formed so that even when heat treatment is performed in a magnetic field for the antiferromagnetic layers 20 and 130, the thickness of each nonmagnetic metal layer is not transformed into a regular crystal structure and is maintained in a irregular crystal state.

As described above, since having the irregular crystal structures even after the heat treatment, the nonmagnetic metal layers having the same compositions as those of the antiferromagnetic layers 20 and 130 do not exhibit antiferromagnetic properties, and as a result, exchange coupling is not generated with the first magnetic layer 17 and 117. Since the nonmagnetic metal layer has a small thickness, the shunt of sense current can be suppressed, and as a result, the output can be improved. In addition, since exchange coupling is not generated, even when the temperature of the nonmagnetic metal layer is increased higher than blocking temperatures of the antiferromagnetic layers 20 and 130, the magnetization will not be insecurely fixed, that is, for example, the directions of magnetization of the fixed magnetic layers 16 and 116 are not reversed.

In the case in which the nonmagnetic metal layer is provided, the following structure is preferably formed since the magnetization of each of the fixed magnetic layers 16 and 116 at the intermediate region 20*c*, that is, at the central portion, can be more tightly fixed.

Figure 7:
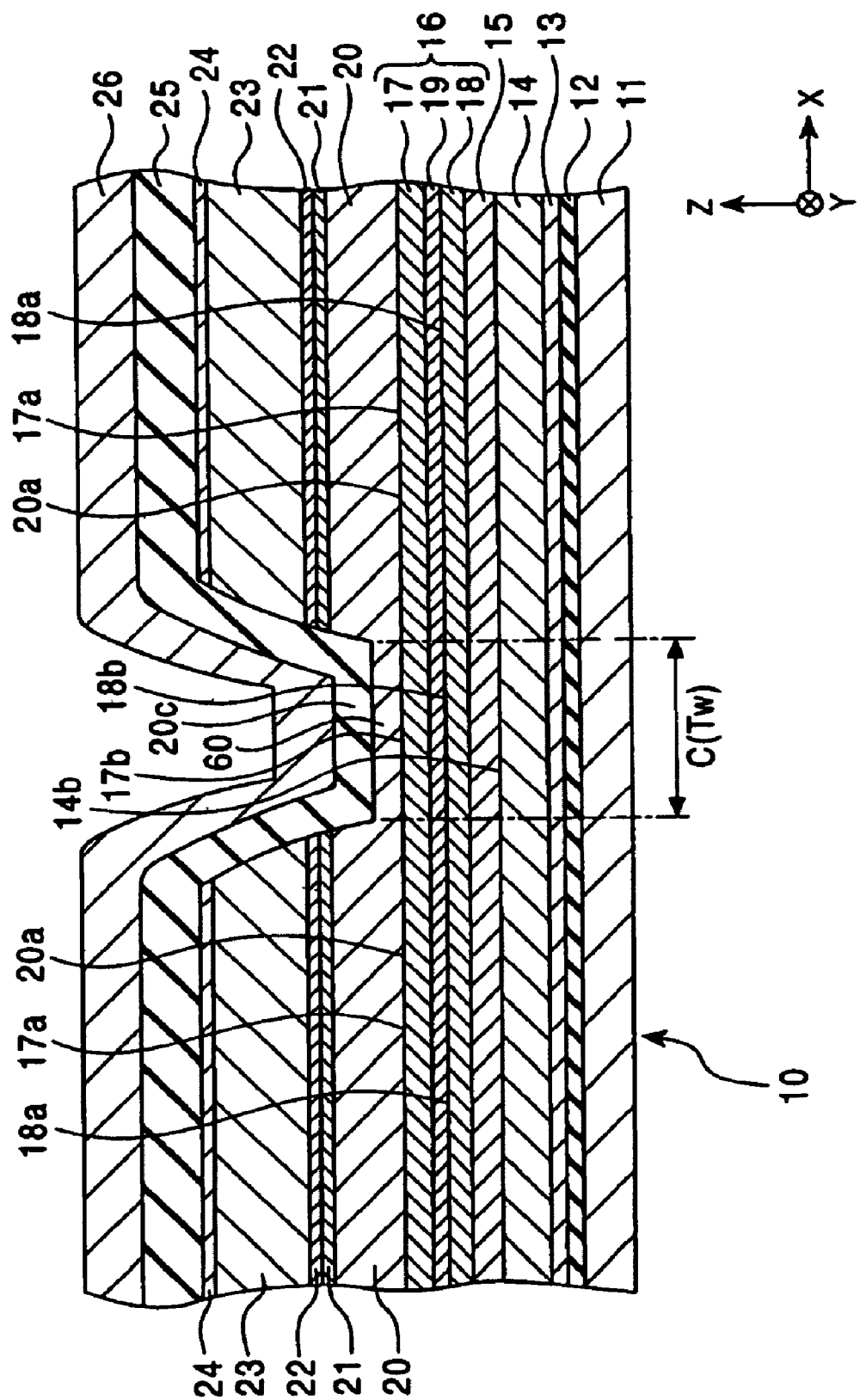
FIG. 7 is a partial cross-sectional view of the structure of a magnetic sensor according to a seventh embodiment of the present invention, the structure being viewed from a face opposing a recording medium.

FIG. 7 shows the structure of the magnetic sensor shown in FIG. 1 in which a nonmagnetic metal layer 60 is formed at the intermediate region 20*c* between the first antiferromagnetic layers 20.

Since having the same composition as that of each of the first antiferromagnetic layers 20, which are formed at the two sides of the nonmagnetic metal layer 60 in the track width direction, the nonmagnetic metal layer 60 is formed, for example, of a PtMn alloy or an X—Mn alloy (where X is at least one selected from the group consisting of Pt, Pd, Ir, Rh, Ru, Os, Ni, and Fe).

The thickness of the nonmagnetic metal layer 60 may be smaller than that of the first antiferromagnetic layer 20 and is preferably 5 to 50 Å.

When the thickness of the nonmagnetic metal layer 60 formed of a PtMn alloy or an X—Mn alloy (where X is at least one selected from the group consisting of Pt, Pd, Ir, Rh, Ru, Os, Ni, and Fe) is in the range as described above, the nonmagnetic metal layer 60 maintains a face-centered cubic structure (fcc) which is the structure obtained in film formation. It is not preferable that the nonmagnetic metal layer 60 have a thickness of more than 50 Å since the transformation thereof will occur into a CuAuI type regular face-centered tetragonal structure (fct) when heating is performed to approximately 250° C. or more. However, although having a thickness of more than 50 Å, when the nonmagnetic metal layer 60 is not heated to approximately 250° C. or more, the nonmagnetic metal layer 60 will maintain a face-centered cubic structure (fcc) which is obtained in film formation.

When the nonmagnetic metal layer 60 formed of a PtMn alloy or an X—Mn alloy (where X is at least one selected from the group consisting of Pt, Pd, Ir, Rh, Ru, Os, Ni, and Fe) has a face-centered cubic structure (fcc), at the interface between this nonmagnetic metal layer 60 and the central portion 17*b* of the first magnetic layer 17, an exchange coupling magnetic field is not generated, or even when generated, the magnitude of the exchange coupling magnetic field is very small, and as a result, the magnetization of the central portion 17*b* of the first magnetic layer 17 cannot be fixed thereby. This situation is the same as described above, and a bias magnetic field by exchange interaction in the magnetic layers and/or a coupling magnetic field by the RKKY interaction acts on the first magnetic layer 17.

According to the structure shown in FIG. 7, in addition to the action described above, unidirectional anisotropy at the central portion of the fixed magnetic layer 16 also serves to fix the magnetization of the fixed magnetic layer 16 stably at the central portion thereof.

In the embodiment shown in FIG. 7, the thickness of the second magnetic layer 18 is larger than that of the first magnetic layer 17. For example, the magnetization of the second magnetic layer 18 is oriented in the height direction (Y direction in the figure), and the magnetization of the first magnetic layer 17 is fixed antiparallel to the height direction.

The thickness of the first magnetic layer 17 is 10 to 30 Å, and the thickness of second magnetic layer 18 is 15 to 35 Å. When the thickness of the first magnetic layer 17 is increased, the coercive force is increased. However, when the thickness of the first magnetic layer 17 is large, the shunt loss is increased. In addition, when atoms of the central portion 17*b* of the first magnetic layer 17 are aligned with those of the nonmagnetic metal layer 60, a strain is generated in the crystal structure, and by this strain, a magnetostriction constant λ and unidirectional anisotropy are increased. However, when the thickness of the first magnetic layer 17 is too large, the strain generated in the vicinity of the interface between the central portion 17*b* of the first magnetic layer 17 and the nonmagnetic metal layer 60 is relatively decreased in consideration of the entire volume of the first magnetic layer 17, and as a result, the magnetostriction constant λ and the unidirectional anisotropy are also decreased.

In this embodiment, of the induced magnetic anisotropy and the magnetoelastic effect, each of which determines the uniaxial anisotropy that fixes the magnetization of the fixed magnetic layer 16 at the central portion thereof, the magnetoelastic effect is primarily exploited.

The magnetoelastic effect is determined by magnetoelastic energy. The magnetoelastic energy is defined by a stress applied to the fixed magnetic layer 16 and the magnetostriction constant λ of the central portion thereof.

Figure 10:
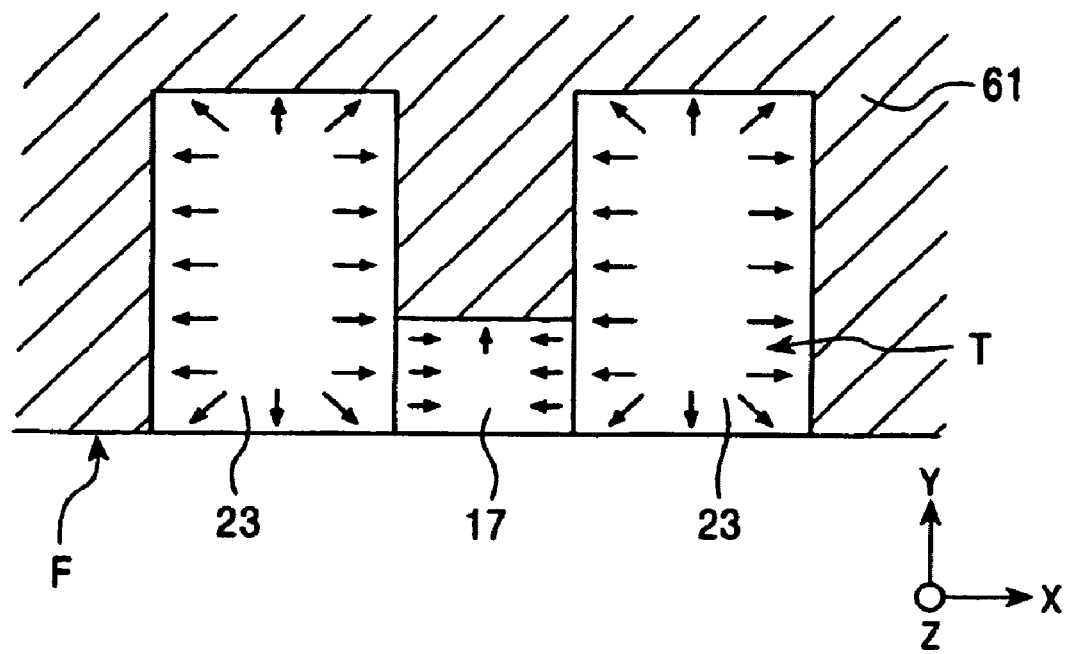
FIG. 10 is a partial plan view of the magnetic sensor shown in FIG. 7.

FIG. 10 is a partial plan view of the magnetic sensor shown in FIG. 7 when it is viewed from the upper side (along the direction opposite to Z direction in the figure) in the figure. In FIG. 10, among layers forming a magnetic sensor T, the electrode layers 23 and the first magnetic layer 17 are shown, and the other layers are omitted.

In addition, as shown in FIG. 10, the periphery of the magnetic sensor T is surrounded by an insulating material 61 indicated by oblique lines.

In addition, an end surface F of the magnetic sensor T at the face opposing a recording medium is an open end surface, that is, the end surface F is exposed or is covered only with a thin protection layer composed of diamond-like carbon (DLC) having a thickness of 20 to 50 Å.

Due to the presence, for example, of the gap layers 12 and 25 located at the top and the bottom of the magnetic sensor T, the stress applied to the magnetic sensor was two-dimensionally isotropic; however, since the end surface F becomes the open end surface, the symmetry of the stress is no longer maintained, and as a result, a unidirectional tensile stress is applied to the magnetic sensor T in the direction parallel to the height direction (Y direction in the figure). In addition, as shown in FIG. 10, due to the presence of internal stresses of the electrode layers, compressive stresses in the direction parallel to the track width direction and in the direction antiparallel thereto are generated from the electrode layers 23, and after these compressive stresses are passed to the lower side of the magnetic sensor T, the tensile stress in the height direction and the compressive stresses in the track width direction are applied to the fixed magnetic layer 16 having the open end surface F at the face opposing a recording medium. In addition, when the first magnetic layer 17 is formed of a magnetic material having a positive magnetostriction constant, by the magnetoelastic effect, an easy axis of magnetization of the first magnetic layer 17 becomes parallel to the direction toward the rear side (height direction, or Y direction in the figure) of the magnetic sensor.

In the embodiment shown in FIG. 7, by increasing the magnetostriction constant of the central portion of the fixed magnetic layer 16, the magnetoelastic energy acting on the central portion described above is increased, and in accordance with this increase the uniaxial anisotropy of the central portion of the fixed magnetic layer 16 is increased. When the uniaxial anisotropy of the central portion of the fixed magnetic layer 16 is increased, since the magnetization thereof is tightly fixed in a predetermined direction even when the exchange coupling magnetic field with the first magnetic layer 17 is not present, unlike the magnetizations at the two side portions of the fixed magnetic layer 16, the output of the magnetic sensor is increased, and the stability and the symmetry of the output are improved.

In particular, by bonding the central portion 17b of the first magnetic layer 17 forming the fixed magnetic layer 16 to the nonmagnetic metal layer 60, the strain is generated in the crystal structure of the central portion 17b of the first magnetic layer 17, thereby increasing the magnetostriction constant λ of the central portion 17b thereof.

The nonmagnetic metal layer 60 has an fcc structure, and equivalent crystal planes represented by a {111} plane are preferentially oriented in the direction parallel to the interface.

On the other hand, when the first magnetic layer 17 of the fixed magnetic layer 16 is formed of Co or $Co_xFe_y$ (where y≦20 and x+y=100 are satisfied), the first magnetic layer 17 has a face-centered cubic (fcc) structure. In the first magnetic layer 17, equivalent crystal planes represented by a {111} plane are preferentially oriented in the direction parallel to the interface.

Accordingly, atoms forming the central portion 17b of the first magnetic layer 17 and atoms forming the nonmagnetic metal layer 60 are likely to be aligned with each other, and hence the crystal of the nonmagnetic metal layer 60 and the crystal of the central portion of the fixed magnetic layer 16 are placed together in an epitaxial state.

However, the nearest interatomic distance of the {111} plane of the central portion 17b of the first magnetic layer 17 and the nearest interatomic distance of the {111} plane of the nonmagnetic metal layer 60 must be different by a predetermined level or more.

While the atoms forming the nonmagnetic metal layer 60 and the atoms of the central portion 17b of the first magnetic layer 17 are being aligned with each other, in order to generate the strain in the crystal structure for increasing the magnetostriction of the central portion 17b of the first magnetic layer 17, the Pt content of the PtMn alloy of the nonmagnetic metal layer 60 and the X element content of the X—Mn alloy is preferably adjusted.

For example, when the Pt content of the PtMn alloy or the X element content of the X—Mn alloy is set to 51 atomic percent or more, the magnetostriction of the central portion 17b of the first magnetic layer 17 to be aligned with the nonmagnetic metal layer 60 is rapidly increased. In addition, when the Pt content of the PtMn alloy or the X element content of the X—Mn alloy is set in the range of from 55 to 95 atomic percent, the magnetostriction of the central portion 17b of the first magnetic layer 17 is increased and is also stabilized.

In addition, a value (hereinafter referred to as "mismatch value") is preferably set in the range of from 0.05 to 0.20. The mismatch value described above is obtained when the difference between the nearest interatomic distance of the {111} plane of the nonmagnetic metal layer 60 and the nearest interatomic distance of the {111} plane of the central portion 17b of the first magnetic layer 17 of the fixed magnetic layer 16 is divided by the nearest interatomic distance of the {111} plane of the central portion 17b of the first magnetic layer 17.

Figure 11:
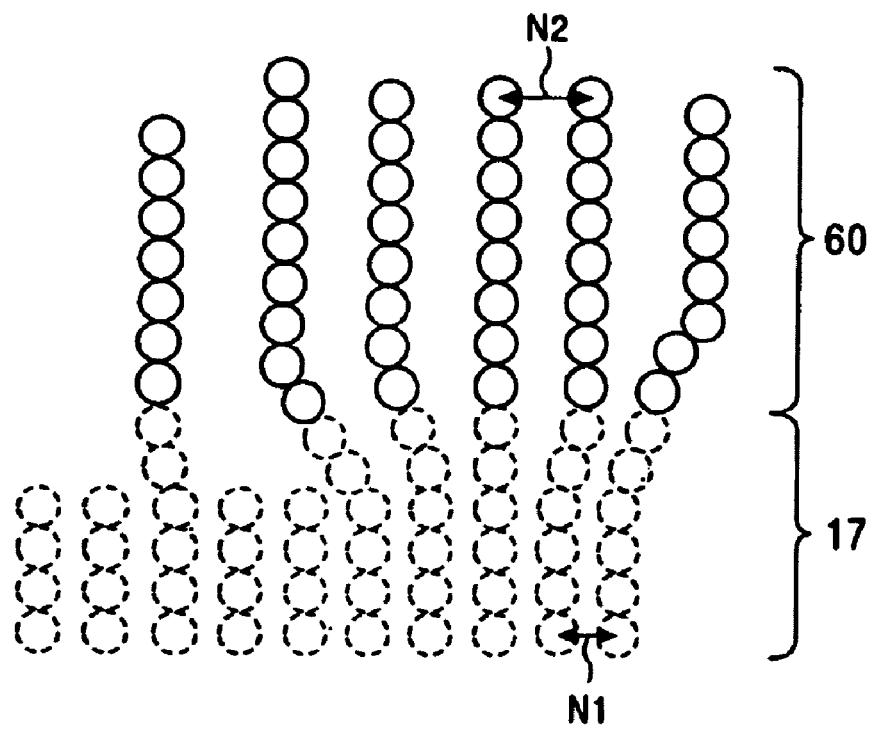
FIG. 11 is a schematic view showing the state in which a strain is generated while atoms of a nonmagnetic metal layer and atoms of a central portion of a first magnetic layer of a fixed magnetic layer are being aligned with each other.

In the magnetic sensor of this embodiment, as schematically shown in FIG. 11, while the atoms forming the nonmagnetic metal layer 60 and the atoms of the central portion 17b of the first magnetic layer 17 are being aligned with each other, the strain is generated in the crystal structure in the vicinity of the interface.

In FIG. 11, reference label N1 indicates the nearest interatomic distance of the {111} plane of the central portion 17b of the first magnetic layer 17, and reference label N2 indicates the nearest interatomic distance of the {111} plane of the nonmagnetic metal layer 60. The nearest interatomic distances indicated by N1 and N2 are measured at a place apart from the interface between the nonmagnetic metal layer 60 and the central portion 17b of the first magnetic layer 17 at which the influence of the strain is small.

As described above, when the stain is generated in the crystal structure of the central portion 17b of the first magnetic layer 17, the magnetostriction constant λ thereof can be increased, and as a result, a significant magnetoelastic effect can be obtained.

Figure 12:
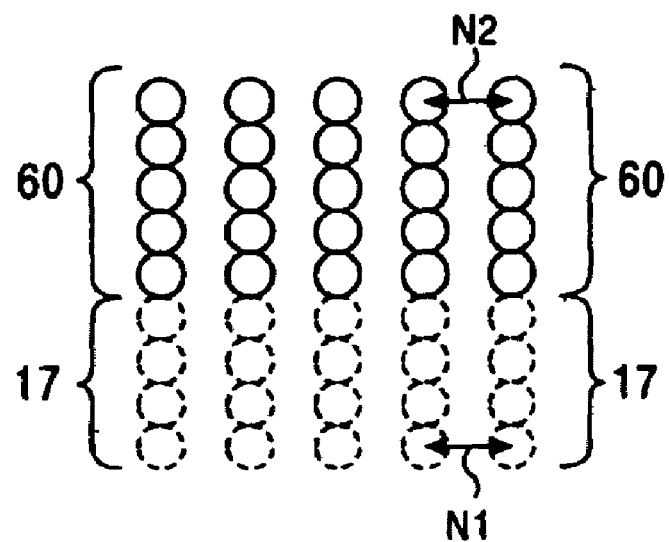
FIG. 12 is a schematic view showing the state in which atoms of a nonmagnetic metal layer and atoms of a central portion of a first magnetic layer of a fixed magnetic layer are aligned with each other.

When the mismatch value obtained from the nonmagnetic metal layer 60 and the central portion 17b of the first magnetic layer 17 is too small, as schematically shown in FIG. 12, when the atoms of the nonmagnetic metal layer 60 and the atoms of the central portion 17b of the first magnetic layer 17 are aligned with each other, the strain is not generated in the crystal structure in the vicinity of the interface, and as a result, the magnetostriction constant λ of the central portion 17b of the first magnetic layer 17 cannot be increased.

Figure 13:
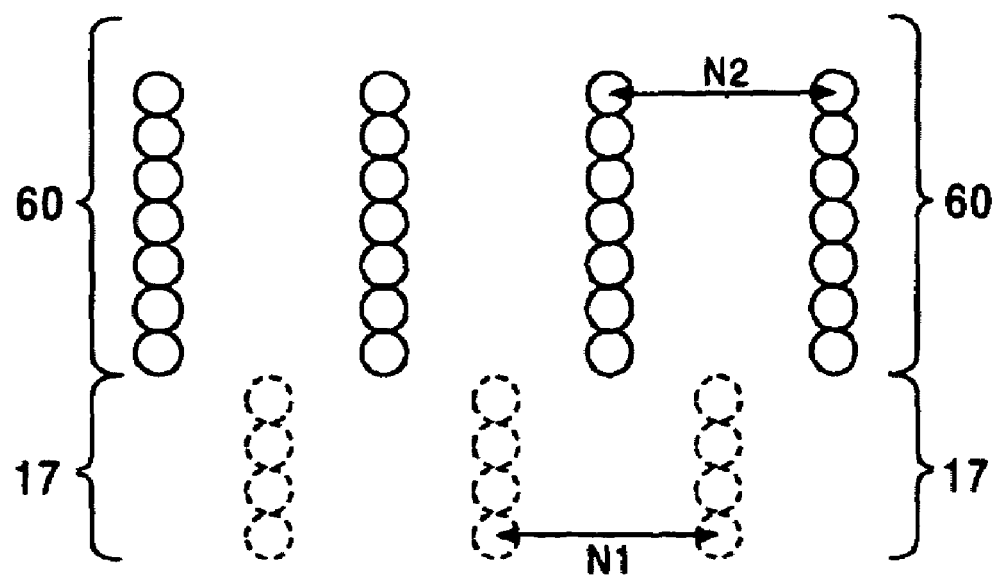
FIG. 13 is a schematic view showing the state in which atoms of a nonmagnetic metal layer and atoms of a central portion of a first magnetic layer of a fixed magnetic layer are not aligned with each other.

On the other hand, when the mismatch vale obtained from the nonmagnetic metal layer 60 and the central portion 17b of the first magnetic layer 17 becomes too large, as schematically shown in FIG. 13, the atoms of the nonmagnetic metal layer 60 and the atoms of the central portion 17b of the first magnetic layer 17 are not aligned with each other and are placed in a non-epitaxial state or a non-aligned state. When the atoms of the nonmagnetic metal layer 60 and the atoms of the central portion 17b of the first magnetic layer 17 are placed in a non-epitaxial state or a non-aligned state, the strain is not generated in the crystal structure in the vicinity of the interface, and as a result, the magnetostriction constant λ of the central portion 17b of the first magnetic layer 17 cannot be increased.

In addition, the central portion 17b of first magnetic layer 17 of the fixed magnetic layer 16 may also have a body-centered cubic (bcc) structure, so that equivalent crystal planes represented by a {110} plane is preferentially oriented in the direction parallel to the interface.

For example, when the first magnetic layer 17 of the fixed magnetic layer 16 is formed of $Co_xFe_y$ (where y≧20 and x+y=100 are satisfied), the first magnetic layer 17 has a body-centered cubic (bcc) structure.

As described above, the nonmagnetic metal layer 60 has an fcc structure, and equivalent crystal planes represented by a {111} plane is preferentially oriented in the direction parallel to the interface.

Since the atomic arrangement of equivalent crystal planes represented by the {110} plane of a crystal having a bcc structure and the atomic arrangement of equivalent crystal planes represented by the {111} plane of a crystal having an fcc structure are similar to each other, the crystal having a bcc structure and the crystal having an fcc structure can be placed in an alignment state, that is, in a heteroepitaxial state, in which the atoms of the individual structures are aligned with each other.

In addition, the nearest interatomic distance of the {110} plane of the central portion 17b of the first magnetic layer 17 differs from that of the {111} plane of the nonmagnetic metal layer 60 by a predetermined level or more. Accordingly, in the vicinity of the interface between the central portion 17b of the first magnetic layer 17 and the nonmagnetic metal layer 60, while the atoms forming the central portion 17b of the first magnetic layer 17 and the atoms forming the nonmagnetic metal layer 60 are being aligned with each other, strains are generated in the individual crystal structures. Hence, by generating the strain in the crystal structure of the central portion 17b of the first magnetic layer 17, the magnetostriction constant λ of the central portion 17 thereof can be increased.

In addition, Co$_x$Fe$_y$ (where y≧20 and x+y=100 are satisfied) having a bcc structure has a large magnetostriction constant λ than that of Co or Co$_x$Fe$_y$ (where y≦20 and x+y=100 are satisfied) particularly when y is approximately 50, and hence, a larger magnetoelastic effect can be obtained. In addition, Co$_x$Fe$_y$ (where y≧20 and x+y=100 are satisfied) having a bcc structure has a high coercive force, and hence the magnetization of the central portion of the fixed magnetic layer 16 can be tightly fixed.

In the present invention, it is preferable when the atoms forming the central portion 17b of the first magnetic layer 17 and the atoms forming the nonmagnetic metal layer 60 are mostly aligned with each other in the vicinity of the interface therebetween so as to be placed together in an alignment state. For example, as schematically shown in FIG. 11, there may be regions in which part of the atoms forming the central portion 17b of the first magnetic layer 17 and part of the atoms forming the nonmagnetic metal layer 60 are not aligned with each other.

In addition, as a material for the second magnetic layer 18, either Co$_x$Fe$_y$ (where y≧20 and x+y=100 are satisfied) having a bcc structure or Co or Co$_x$Fe$_y$ (where y≦20 and x+y=100 are satisfied) having an fcc structure may be used.

When Co$_x$Fe$_y$ (where y≧20 and x+y=100 are satisfied) having a bcc structure is used as the material for the second magnetic layer 18, a positive magnetostriction can be increased. Co$_x$Fe$_y$ (where y≧20 and x+y=100 are satisfied) having a bcc structure has a large coercive force and can tightly fix the magnetization of the fixed magnetic layer 16 at the central portion thereof. In addition, the RKKY interaction is increased between the first magnetic layer 17 and the second magnetic layer 18 with the interlayer 19 provided therebetween.

On the other hand, since it is in contact with the nonmagnetic material layer 15 and has a significant influence on the magnetoresistive effect, when the second magnetic layer 18 is formed of Co or Co$_x$Fe$_y$ (where y≦20 and x+y=100 are satisfied) having an fcc structure, the magnetoresistive effect is not so much degraded.

In addition, in the embodiment shown in FIG. 7, when the electrode layers 23 are each formed of Cr, α-Ta, or Rh, and when the lattice spacing of the electrodes 23 parallel to the film surface are 0.2044 nm or more, 0.2337 nm or more, or 0.2200 nm or more in the case of the {110} plane of Cr (bcc), the {110} plane of α-Ta (bcc), or the {111} plane of Rh (fcc), respectively, a compressive stress applied to the fixed magnetic layer 16 provided under the electrode layers 23 can be increased. In this case, in directions indicated by the arrows shown in FIG. 10, that is, in directions toward the outside of the electrode layers 23, the electrode layers 23 are expanded, and as a result, compressive stresses can be applied to the fixed magnetic layer 16 in the direction parallel and antiparallel to the track width direction (X direction in the figure).

The lattice spacing of the electrode layers 23 parallel to the film surface can be measured using x-ray diffraction or electron beam diffraction. The lattice spacings of the {110} plane of Cr (bcc), the {110} plane of α-Ta (bcc), and the {111} plane of Rh (fcc) in the bulk state in parallel to the film surface are 0.2040 nm, 0.2332 nm, and 0.2196 nm, respectively, and when the lattice spacings described above are increased, compressive stresses are applied to the fixed magnetic layer 16 by the electrode layers 23.

When the electrode layers 23 are formed of Cr and a soft metal material such as Au, the compressive stresses described above may have the following differences therebetween.

For example, a film, which is formed of a bias underlying layer of Cr 50 Å thick; a hard bias layer including CoPt 200 Å thick, an interlayer of Ta 50 Å thick, and an electrode layer of Au 800 Å thick; and a protection layer of Ta 50 Å thick in that order from the bottom, generates a compressive stress of 280 MPa.

On the other hand, a film, which is formed of a bias underlying layer of Cr 50 Å thick; a hard bias layer including CoPt 200 Å thick, an interlayer of Ta 50 Å thick, and an electrode layer of Cr 1,400 Å thick; and a protection layer of Ta 50 Å thick in that order from the bottom, generates a compressive stress of 670 MPa.

When the electrode layers 23 described above are formed by sputtering, ion beam sputtering is used, and the pressure of Ar, Xe, Kr, or the like in a sputtering chamber is decreased to $5 \times 10^{-3}$ to $1 \times 10^{-1}$ Pa. When the pressure of Ar, Xe, Kr, or the like is low in the sputtering chamber, the probability of collision of the atoms such as Cr forming the electrode layers 23 with atoms such as Xe is decreased, and hence the atoms such as Cr is deposited while retaining high energy. When the atoms such as Cr, which are sputtered from a target and which have high energy, come into a film made of Cr which has been already formed, the electrode layers 23 are expanded toward the outside.

In addition, the magnetostriction of the free magnetic layer 14 is preferably a negative magnetostriction. As described above, the compressive stresses are applied to the magnetic sensor from the two sides thereof, the free magnetic layer 14 having a negative magnetostriction becomes likely to have an easy axis of magnetization parallel or antiparallel to the track width direction (Y direction in the figure) by the magnetoelastic effect.

In addition, since the compressive stress in the vicinity of the central portion of the free magnetic layer 14 is smaller than that at each of the two side portions thereof, the decrease in magnetic field detection sensitivity can be suppressed.

The magnetostriction constant λ of the free magnetic layer 14 is preferably in the range of from $-8 \times 10^{-6} \leq \lambda \leq -0.5 \times 10^{-6}$. When the magnetostriction constant λ of the free magnetic layer 14 is too negative, the reproduction sensitivity of the magnetic sensor is decreased. On the other hand, when the magnetostriction constant λ (absolute value) of the free magnetic layer 14 is too large, the reproduction waveform of the magnetic sensor is liable to be deformed.

In addition, when the structures of the nonmagnetic metal layer 60 and the first magnetic layer 17 are appropriately formed as described above, in particular, in the case in which the longitudinal dimension of the fixed magnetic layer 16 is formed to extend long in the track width direction as shown in FIG. 7, the magnetization of the central portion of the fixed magnetic layer 16 can be further stabilized.

As described above, the free magnetic layer 14 is formed to extend long in the track width direction (first direction), and by this shape anisotropy, the magnetization is oriented in the track width direction. In addition, since the fixed magnetic layer 16 is also formed to extend long in the track width direction as is the free magnetic layer 14, the shape anisotropy is likely to be obtained in the track width direction. In particular, as described with reference to FIG. 7, by exploiting the magnetoelastic effect, the magnetization of the central portion 16b of the fixed magnetic layer 16 can be stably oriented in the height direction, and as a result, a magnetic sensor can be realized which is provided with a reproduction function having a large and stable reproduction output.

Figure 8:
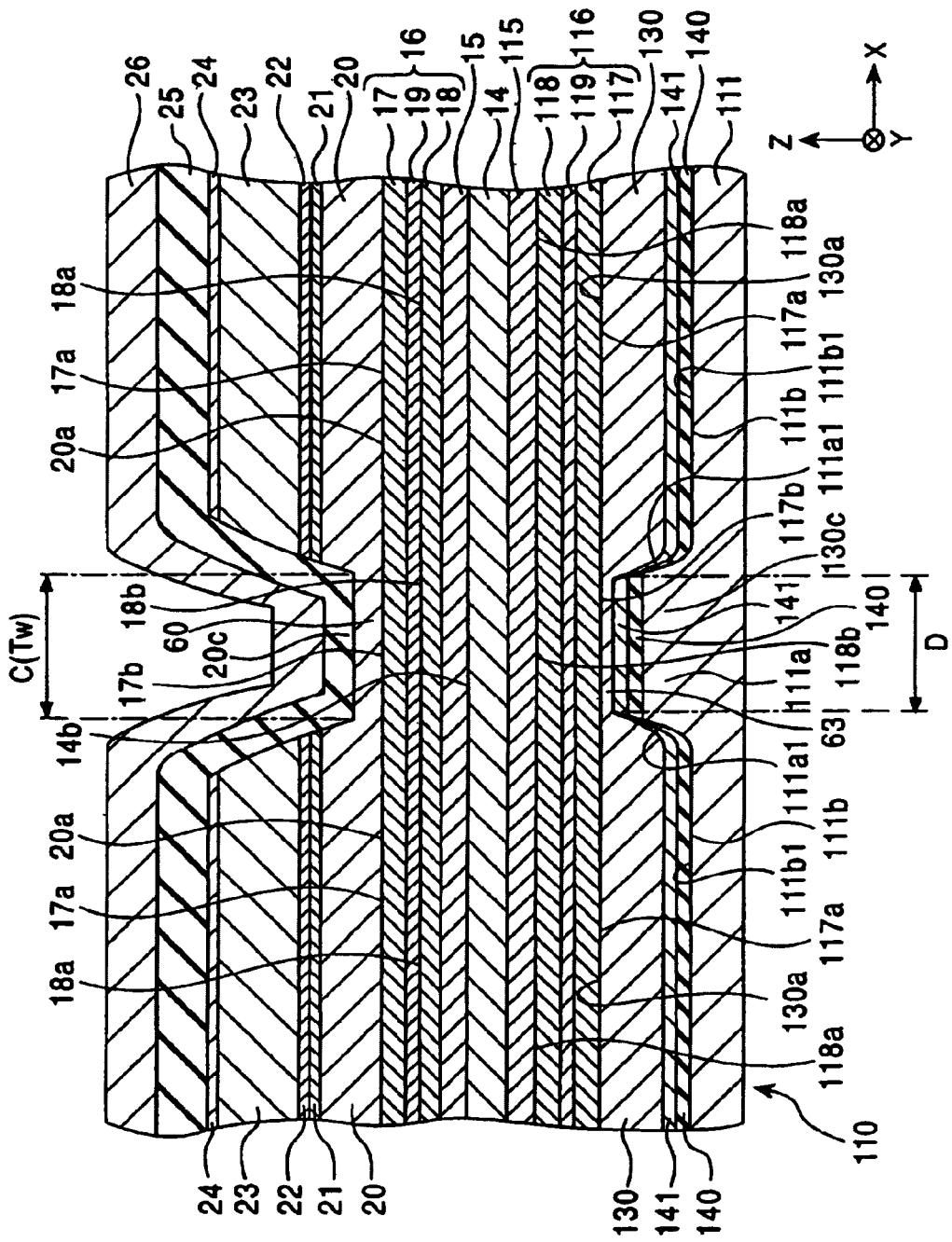
FIG. 8 is a partial cross-sectional view of the structure of a magnetic sensor according to an eighth embodiment of the present invention, the structure being viewed from a face opposing a recording medium.

FIG. 8 shows a modified example of the magnetic sensor shown in FIG. 2, and as is the magnetic sensor shown in FIG. 7, the nonmagnetic metal layer 60 having a small thickness and the same composition as that of the first antiferromagnetic layer 20 is formed between the first antiferromagnetic layers 20 in the track width direction. Since preferable embodiments of the nonmagnetic metal layer 60 and the first magnetic layer 17 were described in detail with reference to FIG. 7, description thereof will be omitted.

In addition, as shown in FIG. 8, at the intermediate region 130c between the second antiferromagnetic layers 130 in the track width direction, a nonmagnetic metal layer 63 is also formed having a small thickness and the same composition as that of the second antiferromagnetic layer 130. Since a material, the crystal orientation, and the like of the nonmagnetic metal layer 63 are the same as those of the nonmagnetic metal layer 60, descriptions thereof will be omitted. In addition, a material, the crystal orientation, and the like of the first magnetic layer 117 forming the fixed magnetic layer 116 are also the same as those of the first magnetic layer 17, description thereof will be omitted.

In the dual spin-valve type thin film element shown in FIG. 8, by providing the nonmagnetic metal layers 60 and 63 having a small thickness at the respective intermediate regions 20c and 130c between the first antiferromagnetic layers 20 and between the second antiferromagnetic layers 130, respectively, the magnetizations can be further stabilized at the central portions of the fixed magnetic layers 46 and 116, and as a result, a magnetic sensor provided with a reproduction function having a large and stable reproduction output can be manufactured.

Figure 9:
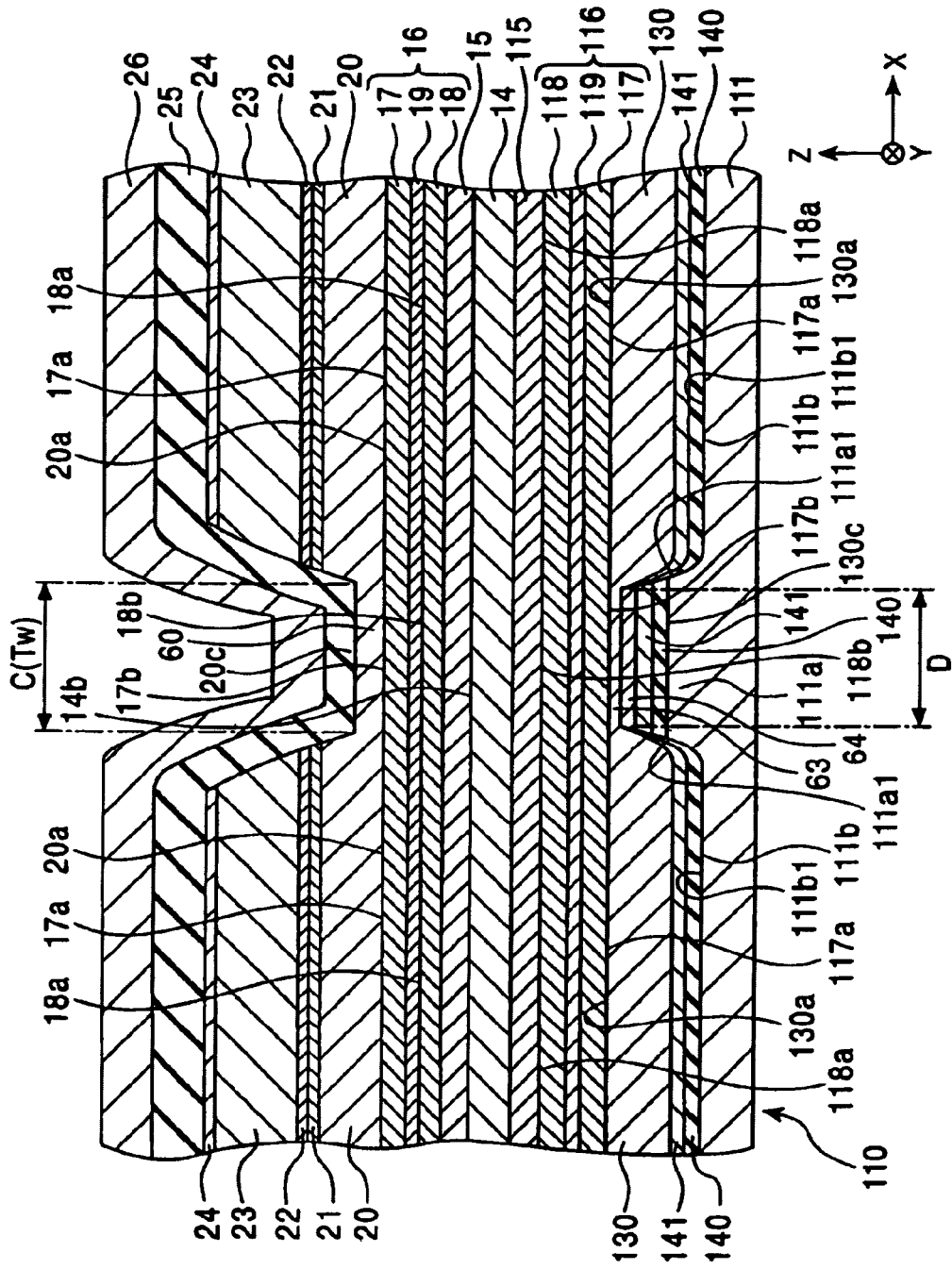
FIG. 9 is a partial cross-sectional view of the structure of a magnetic sensor according to a ninth embodiment of the present invention, the structure being viewed from a face opposing a recording medium.

FIG. 9 shows a modified example of the magnetic sensor shown in FIG. 8. As shown in FIG. 9, between the seed layer 141 and the nonmagnetic metal layer 63 provided between the antiferromagnetic layers 130, a nonmagnetic metal layer 64 made of at least one element selected from the group consisting of Ru, Re, Os, Ti, Rh, Ir, Pd, Pt, and Al is provided.

The nearest interatomic distance of the {111} plane or a C plane of the nonmagnetic metal layer 64 made of Ru or the like is smaller than that of the {111} plane of the nonmagnetic metal layer 63 made of a PtMn alloy or X—Mn (where X is at least one selected from the group consisting of Pd, Ir, Rh, Ru, Os, Ni, and Fe). In the case described above, the nearest interatomic distance in the direction parallel to the film surface can be increased in a stepwise manner from the seed layer 141 to the nonmagnetic metal layer 63, and hence the ratio of non-aligned regions formed by an excessive strain, which is generated in the central portion 117b of the first magnetic layer 117, can be reduced.

Figure 14:
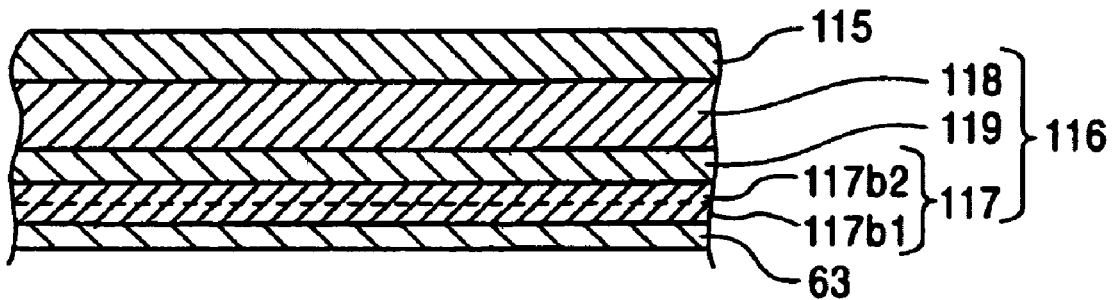
FIG. 14 is a partial cross-sectional view showing the vicinity of a central portion of a fixed magnetic layer of a magnetic sensor according to the present invention.
Figure 15:
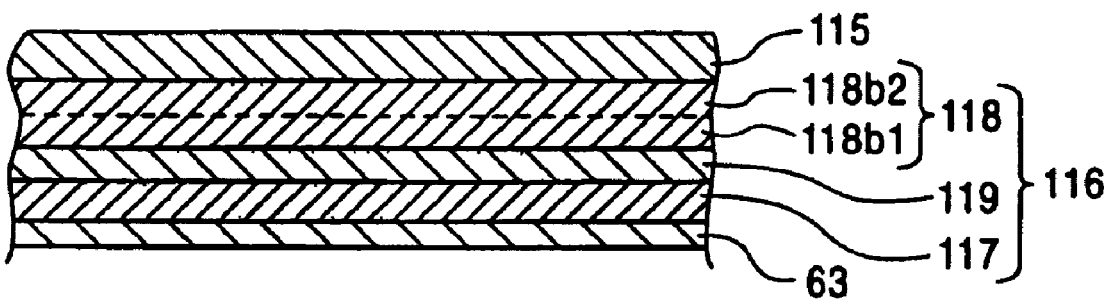
FIG. 15 is a partial cross-sectional view showing the vicinity of a central portion of a fixed magnetic layer of a magnetic sensor according to the present invention.
Figure 16:
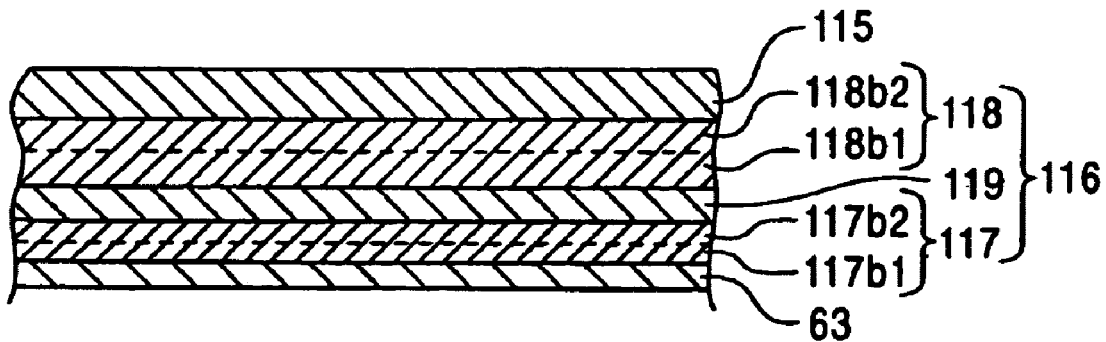
FIG. 16 is a partial cross-sectional view showing the vicinity of a central portion of a fixed magnetic layer of a magnetic sensor according to the present invention.

FIGS. 14 to 16 are partial cross-sectional views showing other embodiments of the fixed magnetic layer 116 (although the fixed magnetic layer 16 provided with the antiferromagnetic layers formed thereon may also be applied to the same embodiments as mentioned above, in these embodiments, the fixed magnetic layer 116 will be described which is provided with the antiferromagnetic layers formed thereunder). In addition, FIGS. 14 to 16 are enlarged views of the fixed magnetic layer 116 in vicinity of the element central portion shown in FIG. 8.

As shown in FIG. 14, the first magnetic layer 117 forming the fixed magnetic layer 116 may be composed of an fcc magnetic layer 117b1 provided at the nonmagnetic metal layer 63 side and a bcc magnetic layer 117b2 provided at the interlayer 119 side.

The fcc magnetic layer 117b1 has a face-centered cubic (fcc) structure and is a magnetic layer in which equivalent crystal planes represented by a {111} plane are preferentially oriented in the direction parallel to the interface, and the bcc magnetic layer 117b2 has a body-centered cubic (bcc) structure and is a magnetic layer in which equivalent crystal planes represented by a {110} plane are preferentially oriented in the direction parallel to the interface.

The fcc magnetic layer 117b1 is formed of Co or $Co_xFe_y$ (where $y \leq 20$ and $x+y=100$ are satisfied), and the bcc magnetic layer 117b2 is formed of $Co_xFe_y$ (where $y \geq 20$ and $x+y=100$ are satisfied).

When the first magnetic layer 117 in the vicinity of the interface at the interlayer 119 side is formed to have a bcc structure, the magnetostriction constant λ at the central portion 117b of the first magnetic layer 117 can be increased, and as a result, a large magnetoelastic effect can be obtained. In addition, when the composition at the interlayer 119 side is $Co_xFe_y$ (where $y \geq 20$ and $x+y=100$ are satisfied), the RKKY interaction is increased between the first magnetic layer 117 and the second magnetic layer 118 with the interlayer 119 provided therebetween.

On the other hand, when the first magnetic layer 117 in the vicinity of the interface at the nonmagnetic metal layer 63 side is formed to have an fcc structure, the crystal orientation properties at the central portions of the fixed magnetic layer 116, the nonmagnetic material layer 115, and the free magnetic layer 14 become uniform, the size of crystal grain is also increased, and as a result, the rate (MR ratio) of change in magneto-resistance can be increased.

In addition, as shown in FIG. 15, the second magnetic layer 118 forming the fixed magnetic layer 116 may be composed of an fcc magnetic layer 118b2 provided at the nonmagnetic material layer 115 side and a bcc magnetic layer 118b1 provided at the interlayer 119 side.

The fcc magnetic layer 118b2 has a face-centered cubic (fcc) structure and is a magnetic layer in which equivalent crystal planes represented by a {111} plane are preferentially oriented in the direction parallel to the interface, and the bcc magnetic layer 118b1 has a body-centered cubic (bcc) structure and is a magnetic layer in which equivalent crystal planes represented by a {110} plane are preferentially oriented in the direction parallel to the interface.

The fcc magnetic layer 118b2 is formed of Co or $Co_xFe_y$ (where $y \leq 20$ and $x+y=100$ are satisfied), and the bcc magnetic layer 118b1 is formed of $Co_xFe_y$ (where $y \geq 20$ and $x+y=100$ are satisfied).

When the second magnetic layer 118 in the vicinity of the interface at the interlayer 119 side is formed to have a bcc structure, the magnetostriction constant λ at the central portion 118b of the second magnetic layer 118 can be increased, and as a result, a large magnetoelastic effect can be obtained. In addition, when the composition at the interlayer 119 side is $Co_xFe_y$ (where $y \geq 20$ and $x+y=100$ are satisfied), the RKKY interaction is increased between the first magnetic layer 117 and the second magnetic layer 118 provided with the interlayer 119 therebetween.

On the other hand, when the central portion 117b of the first magnetic layer 117 in the vicinity of the interface at the nonmagnetic metal layer 63 side is formed to have an fcc structure, the degradation of the magnetoresistive effect can be suppressed.

In addition, as shown in FIG. 16, the first magnetic layer 117 forming the fixed magnetic layer 116 may be composed of the fcc magnetic layer 117b1 provided at the nonmagnetic metal layer 63 side and the bcc magnetic layer 117b2 provided at the interlayer 119 side. Furthermore, the second magnetic layer 118 may be composed of the fcc magnetic layer 118b2 provided at the nonmagnetic material layer 115 side and the bcc magnetic layer 118b1 provided at the nonmagnetic interlayer 119 side.

In FIGS. 14 to 16, the first magnetic layer 117 has a multilayer structure composed of the fcc magnetic layer 117b1 and the bcc magnetic layer 117b2 provided thereon, and in addition, the second magnetic layer 118 has a multilayer structure composed of the bcc magnetic layer 118b1 and the fcc magnetic layer 118b2 provided thereon.

However, according to the present invention, in the vicinity of the interface at the nonmagnetic metal layer 63 side, the first magnetic layer 117 of the fixed magnetic layer 116 may have a face-centered cubic (fcc) structure in which equivalent crystal planes represented by a {111} plane are preferentially oriented in the direction parallel to the interface, and in addition, in the vicinity of the interface at the interlayer 119 side, the first magnetic layer 117 of the fixed magnetic layer 116 may have a body-centered cubic (bcc) structure in which equivalent crystal planes represented by a {110} plane are preferentially oriented in the direction parallel to the interface.

Accordingly, the following, structure may also be used in the present invention. That is, the first magnetic layer 117 of the fixed magnetic layer 116 in the vicinity of the interface at the nonmagnetic metal layer 63 side is composed of Co or $Co_xFe_y$ (where $y \leq 20$ and $x+y=100$ are satisfied) and has an fcc structure in which equivalent crystal plane represented by a {111} plane are preferentially oriented in the direction parallel to the interface. In addition, the Fe concentration is gradually increased from the vicinity of the nonmagnetic metal layer 63 side to that of the interlayer 119 side so as to have a composition represented by $Co_xFe_y$ (where $y \geq 20$ and $x+y=100$ are satisfied) in the vicinity of the interface at the interlayer 119 side and have a body-centered cubic (bcc) structure in which equivalent crystal planes represented by a {110} plane are preferentially oriented in the direction parallel to the interface.

In addition, as is the case described above, the second magnetic layer 118 may also be composed of a CoFe alloy in which the Fe concentration is gradually increased from the vicinity of the interface at the nonmagnetic material layer 115 side to that at the interlayer 119 side.

EXAMPLES

Figure 17:
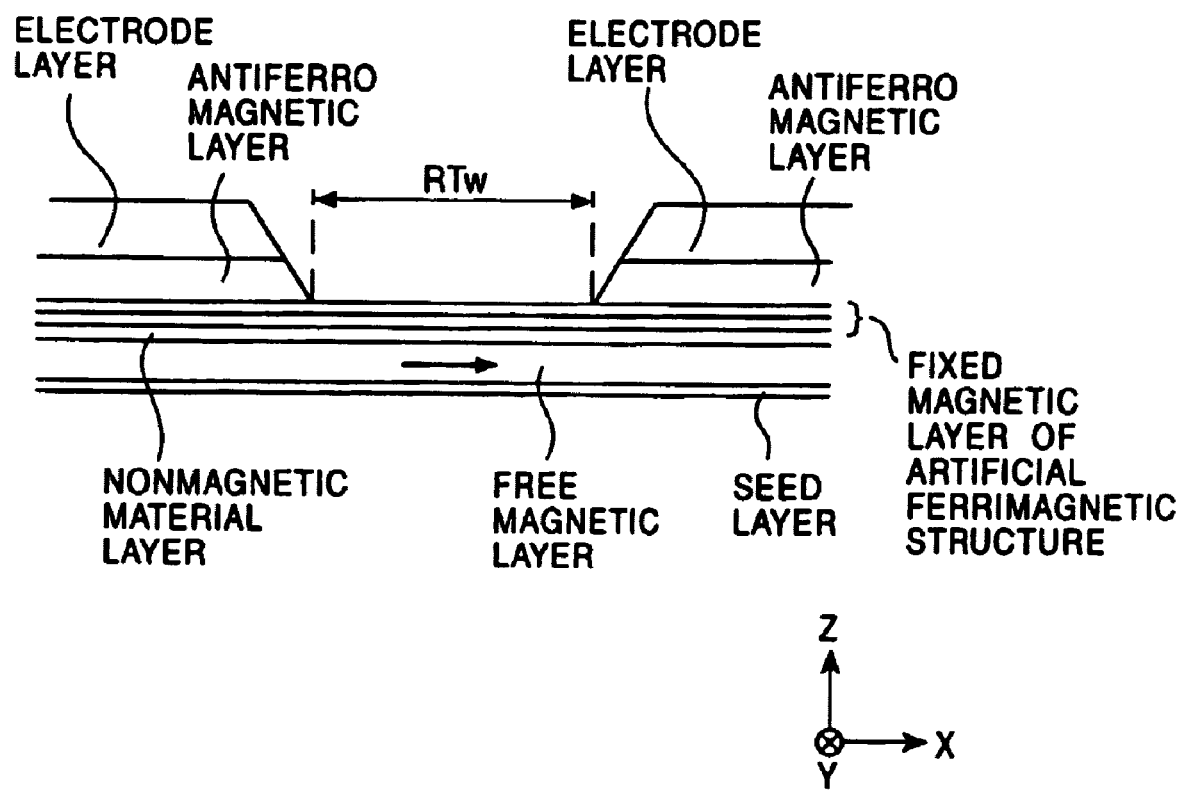
FIG. 17 is a schematic view showing the structure of a magnetic sensor practically used for an experiment according to an example.

By using magnetic sensors having the structures shown in FIG. 17 (example) and shown in FIG. 20 (comparative example), a unidirectional exchange bias magnetic field Hex* and a reproduction output (normalized output) were obtained.

FIG. 17 (example) is a partial cross-sectional view schematically showing a magnetic sensor when it is viewed from the face opposing a recording medium, and the film structure had a seed layer of 60 atomic percent of (Ni0.8Fe0.2) and 40 atomic percent of Cr (60 Å); a free magnetic layer of 80 atomic percent of Ni and 20 atomic percent of Fe (35 Å)/90 atomic percent of Co and 10 atomic percent of Fe (10 Å); a nonmagnetic material layer of Cu (21 Å); a fixed magnetic layer [a second magnetic layer of 90 atomic percent of Co and 10 atomic percent of Fe (X Å)/an interlayer of Ru (9 Å)/a first magnetic layer of 90 atomic percent of Co and 10 atomic percent of Fe (Y Å)]; and antiferromagnetic layers of 50 atomic percent of Pt and 50 atomic percent of Mn (200 Å) provided in the order from the bottom. The parentheses indicate the thickness of the individual films.

As shown in FIG. 17, the magnetization of the free magnetic layer was oriented in the track width direction, that is, the first direction (X direction in the figure); however, a permanent magnet layer or other antiferromagnetic layers, which were used for controlling the magnetization of the free magnetic layer, were not provided. In addition, as shown in FIG. 17, the magnetizations of the first magnetic layer and the second magnetic layer were parallel to the height direction, that is, the second direction (Y direction in the figure), and were antiparallel to each other.

As also shown in FIG. 17, the space was provided between the first antiferromagnetic layers, and from this space, the first magnetic layer forming the fixed magnetic layer was exposed. The width dimension of this space in the width direction was a track width RTw, and this track width direction RTw was a physical track width (Physical Read Track Width).

By variously changing the film thicknesses of the first and the second magnetic layers represented by X and Y Å, respectively, the relationships of the track width RTw with the unidirectional exchange bias magnetic field and the normalized output were obtained. In this example, the magnitude of an external magnetic field at which the rate of change in resistance ($\Delta R/R$) was a half of the maximum value thereof was defined as the unidirectional exchange bias magnetic field (Hex*). Since the fixed magnetic layer described above had a synthetic ferrimagnetic structure, the unidirectional exchange coupling magnetic field means the magnitude of a magnetic field including the coupling magnetic field generated between the CoFe layers forming the fixed magnetic layer by the RKKY interaction in addition to the exchange coupling magnetic field generated between the fixed magnetic layer and the antiferromagnetic layer. When this unidirectional exchange coupling magnetic field is larger, the magnetization of the fixed magnetic layer can be more appropriately fixed in a predetermined direction.

Figure 18:
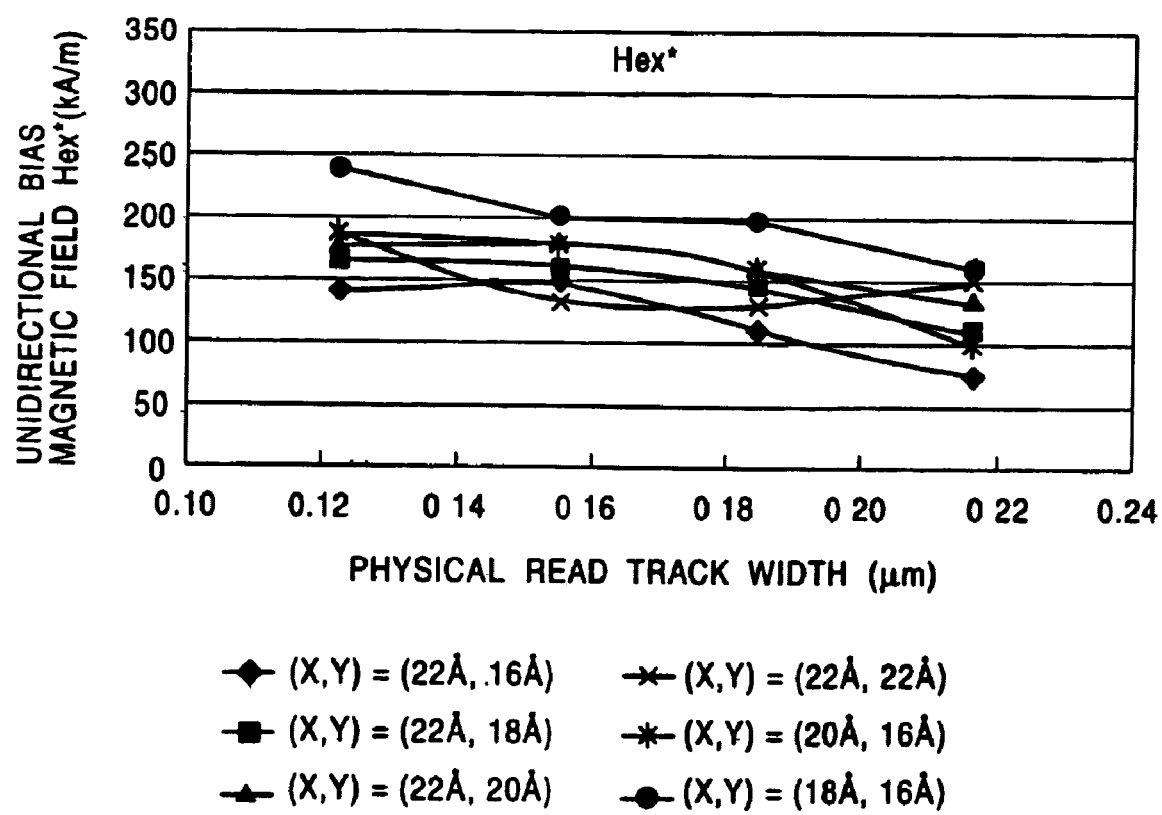
FIG. 18 is a graph showing the relationship between a track width RTw and a unidirectional exchange bias magnetic field Hex*, which is obtained by using the magnetic sensor shown in FIG. 17.

As shown in FIG. 18, as the track width was increased, the unidirectional exchange bias magnetic field was decreased. However, even when the track width RTw was approximately 0.22 μm, a high unidirectional exchange coupling magnetic field of approximately 100 kA/m was generated. Since it has been believed that a unidirectional exchange magnetic field of at least approximately 80 kA/m was necessary to fix the magnetization of the free magnetic layer described above, it was found that there is some degree of freedom for determining the dimension of the track width RTw.

Figure 19:
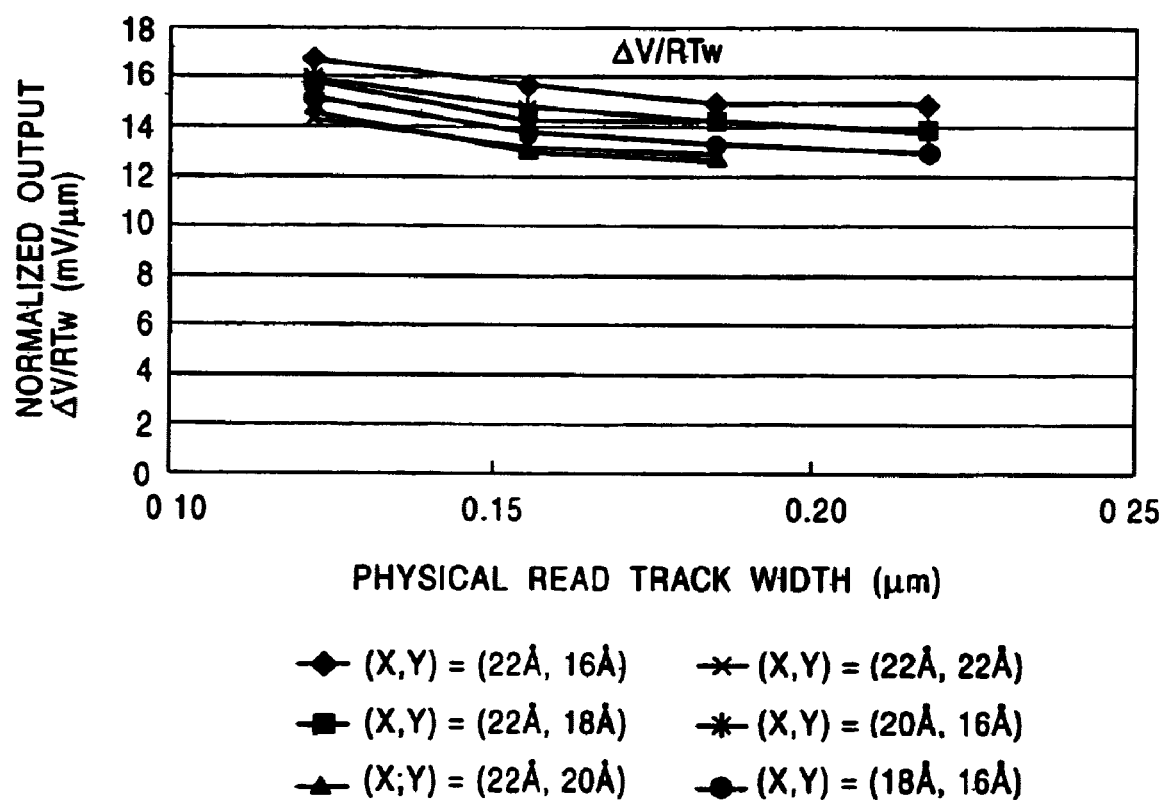
FIG. 19 is a graph showing the relationship between the track width RTw and a normalized output, which is obtained by using the magnetic sensor shown in FIG. 17.

FIG. 19 is a graph showing the relationship between the track width RTw and the reproduction output ($\Delta V/RTw$) normalized by the track width RTw. The normalized output was calculated by dividing the change ($\Delta V$) of voltage, which was obtained when a uniform magnetic field of ±100 Oe (±7,960 A/m),was applied to the magnetic element along the Y direction in the figure, by the track width RTw.

As shown in FIG. 19, as the track width RTw was increased, the normalized output tended to decrease slightly; however, even when the track width RTw exceeded 0.2 μm, it was found that a normalized output of 12 mV/μm or more is maintained.

FIG. 20 (comparative example) is a schematic partial cross-sectional view of a magnetic sensor when it is viewed from the face opposing a recording medium, the magnetic sensor having the same film structure as that shown in FIG. 17. As shown in FIG. 20, the magnetization of the free magnetic layer was oriented in the first direction however, a permanent magnetic layer and other antiferromagnetic layers were not provided in order to control the magnetization of the free magnetic layer. In addition, as shown in FIG. 20, the magnetizations of the first magnetic layer and the second magnetic layer were in parallel to the second direction and were antiparallel to each other.

As was the case shown in FIG. 17, by variously changing the film thicknesses of the first and the second magnetic layers represented by X and Y Å, respectively, the relationships of the track width RTw with the unidirectional exchange bias magnetic field and the normalized output were obtained. As shown in FIG. 20, in the magnetic sensor, the antiferromagnetic layer 20 was not separated unlike the case shown in FIG. 17 and was provided all over the first magnetic layer. The electrode layers were provided on the antiferromagnetic layer with a space provided therebetween in the first direction the width, dimension of the space in the first direction was a track width RTw, and the track width RTw was a physical track width (Physical Read Track Width).

Figure 21:
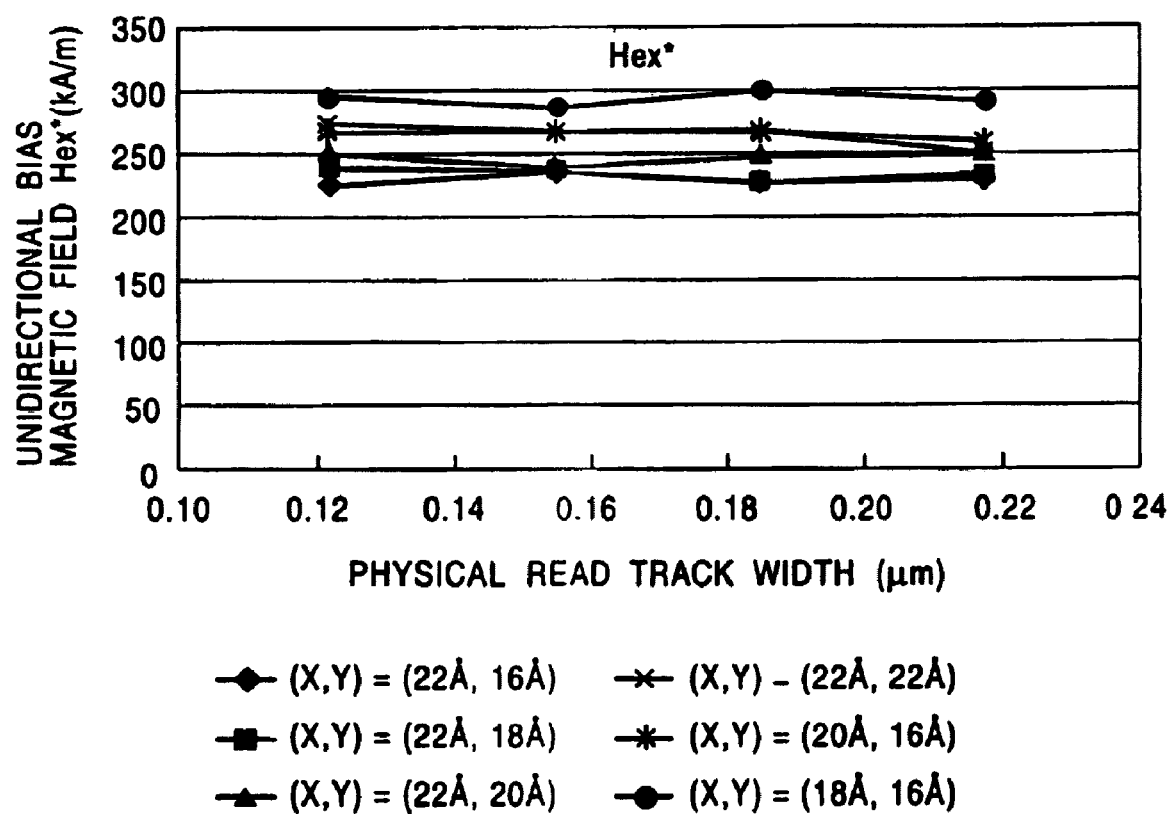
FIG. 21 is a graph showing the relationship between the track width RTw and the unidirectional exchange bias magnetic field Hex*, which is obtained by using the magnetic sensor shown in FIG. 20.
Figure 22:
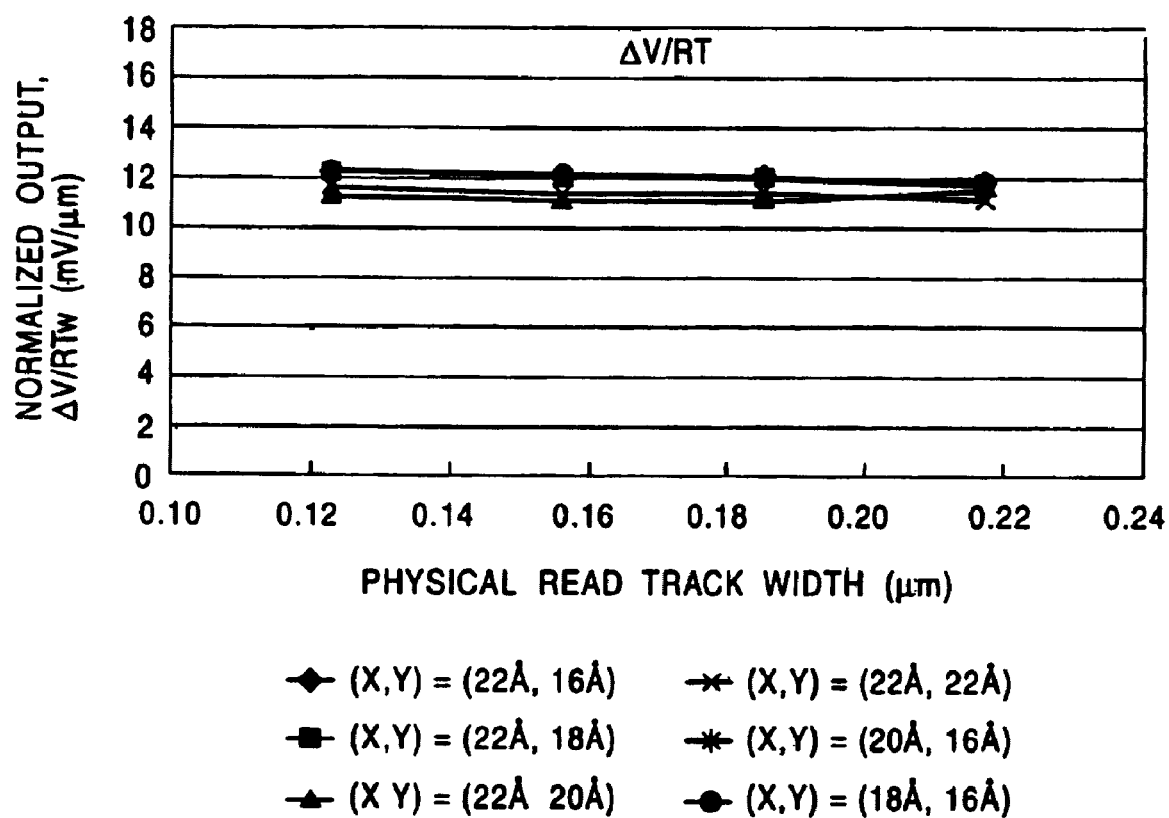
FIG. 22 is a graph showing the relationship between the track width RTw and the normalized output, which is obtained by using the magnetic sensor shown in FIG. 20.

As shown in FIG. 21, even when the track width RTw was increased, the magnitude of the unidirectional exchange bias magnetic field was not so much changed. As also shown in FIG. 22, the normalized output was not changed even when the track width RTw was increased.

In the magnetic sensor according to the embodiment of the present invention, the antiferromagnetic layers are formed with a predetermined space provided therebetween in the track width direction as shown in FIG. 17; however, when the unidirectional exchange bias magnetic field Hex* shown in FIG. 18 is compared with that shown in FIG. 21, the unidirectional exchange bias magnetic field Hex* of the example (shown in FIG. 18) is smaller than that of the comparative example (shown in FIG. 21). The reason for this is believed that since the first antiferromagnetic layer is not provided on the central portion of the first magnetic layer, and in the example, when the track width RTw was appropriately controlled, it was found that the unidirectional exchange bias magnetic field Hex* can be obtained which is appropriately able to fix the magnetization of the fixed magnetic layer.

Since it has been believed that a unidirectional exchange bias magnetic field Hex* of at least approximately 80 kA/m may be large enough as described above, when the track width RTw was set to 0.2 μm or less as shown in FIG. 18, it was found that a unidirectional exchange bias magnetic field Hex* of approximately 80 kA/m or more can be obtained.

Next, when the normalized output shown in FIG. 19 is compared to that shown in FIG. 20, the normalized output of the example is larger than that of the comparative example. The reason for this is believed that since the antiferromagnetic layer is not provided on the central portion of the element in the example, the shunt loss of a sense current flowing from the electrode layers is decreased.

That is, it was found that when the structure is formed as in the example in which the antiferromagnetic layer is not provided on the central portion of the first magnetic layer of the element, a sufficient unidirectional exchange bias magnetic field for fixing the magnetizations of the first magnetic layer and the second magnetic layer can be obtained, and that, in addition, a large reproduction output can be obtained as compared to that in the past.

In addition, as shown in FIGS. 18 and 19, it was found that when the thicknesses of the first magnetic layer and the second magnetic layer are small and the difference therebetween is decreased, the unidirectional exchange bias magnetic field and the normalized output can be increased.

Next, by using the magnetic sensor having the structure shown in FIG. 17 (example), the relationship between the applied magnetic field and the output was obtained.

Figure 23:
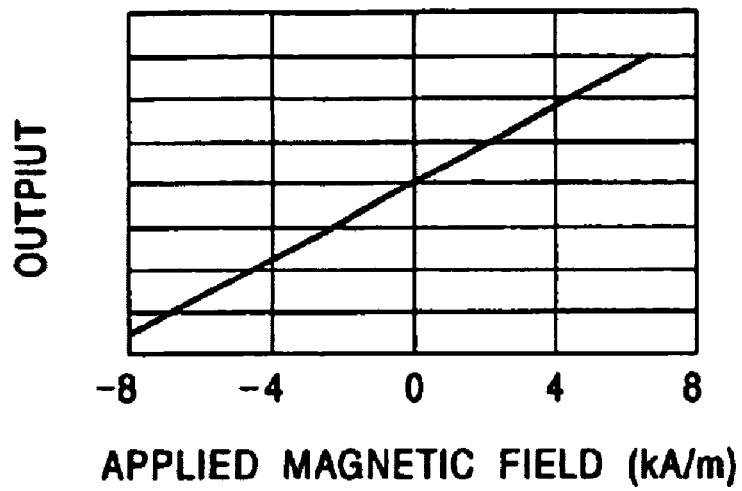
FIG. 23 is a graph showing the relationship between an applied magnetic field and an output, which is obtained by using the magnetic sensor shown in FIG. 17.

As shown in FIG. 23, without, applying a vertical magnetic field in the example, the slope of the line in the graph was approximately constant, and the Barkhausen noise was not generated and the hysteresis did not occur. The reason for this is believed that the direction of magnetization of the free magnetic layer is oriented in the track width direction by the shape anisotropy.

The results described above were obtained by an experiment in which the first antiferromagnetic layers were provided with a space therebetween in the first direction, and the nonmagnetic metal layer having the same composition as that of the first antiferromagnetic layer was not provided in the space.

Accordingly, the following experiment was then performed which primarily focused on the functions of the nonmagnetic metal layer and the first magnetic layer forming the fixed magnetic layer.

First, a CoFe layer (first magnetic layer) was provided on a PtMn layer (nonmagnetic metal layer), and the change in magnetostriction constant of CoFe was measured by changing the composition of the PtMn layer.

The following multilayer film was formed and was then annealed at 290° C. for 4 hours.

The multilayer film had the structure composed of alumina (1,000 Å), (Ni0.8Fe0.2)60Cr40 (52 Å), $Pt_xMn_{100-x}$ (30 Å), Co90Fe10 (20 Å), and Ru (9 Å) provided in that order on a silicon substrate.

For the measurement of the magnetostriction, an optical lever method was used. While the surface of the multilayer film described above was irradiated with laser beams, a magnetic field was applied to the multilayer film in the direction parallel to the film surface thereof. The deflection of the multilayer film caused by magnetostriction was read as the change in reflection angel of the laser beams, and the magnetostriction constant of the multilayer film was obtained thereby.

Figure 24:
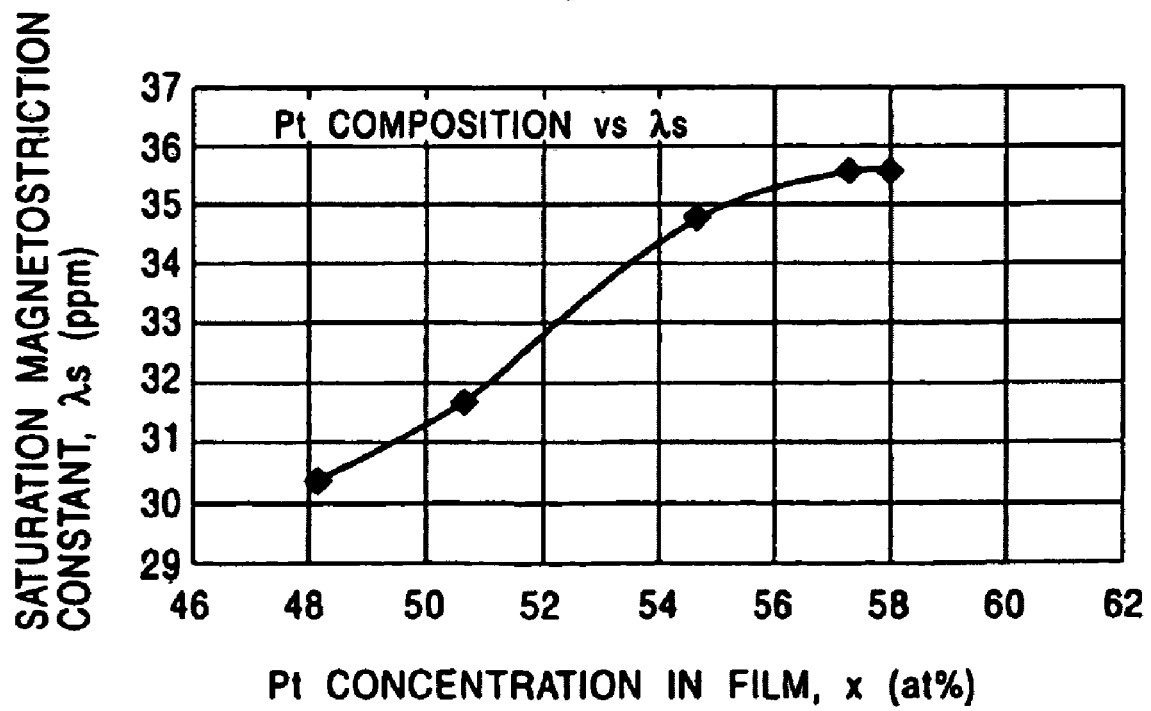
FIG. 24 is a graph showing the change in magnetostriction of CoFe in the case in which a CoFe layer is provided on a PtMn layer and the composition ratio of the PtMn layer is changed.

The results are shown in FIG. 24. As shown in FIG. 24, as the Pt concentration in the PtMn layer was increased, the magnetostriction constant of the multilayer film was increased. In particular, when the Pt concentration was 51 atomic percent or more, the magnetostriction constant was rapidly increased, and when the Pt concentration was 55 atomic percent or more, the rate of increase in magnetostriction constant became low.

The reason for this is believed that as the Pt concentration in the PtMn layer is increased, the crystal lattice constant of the PtMn is increased, and as a result, a strain in the vicinity of the interface between the PtMn layer and the CoFe layer is increased.

Next, after a CoFe layer was provided on a PtMn layer, and a Co layer was provided on a PtMn layer, the changes in magnetostriction constant of CoFe and Co were measured.

The following multilayer film was formed and was then annealed at 290° C. for 4 hours.

The multilayer film had the structure composed of alumina (1,000 Å), (Ni0.8Fe0.2)60Cr40 (52 Å), $Pt_{50}Mn_{50}$ (0 Å or 30 Å), a first magnetic layer (X Å), Ru (9 Å), Cu (85 Å), and Ta (30 Å) provided in that order on a silicon substrate (where the first magnetic layer was $Co_{90}Fe_{10}$ or Co).

For the measurement of the magnetostriction, an optical lever method was used.

Figure 25:
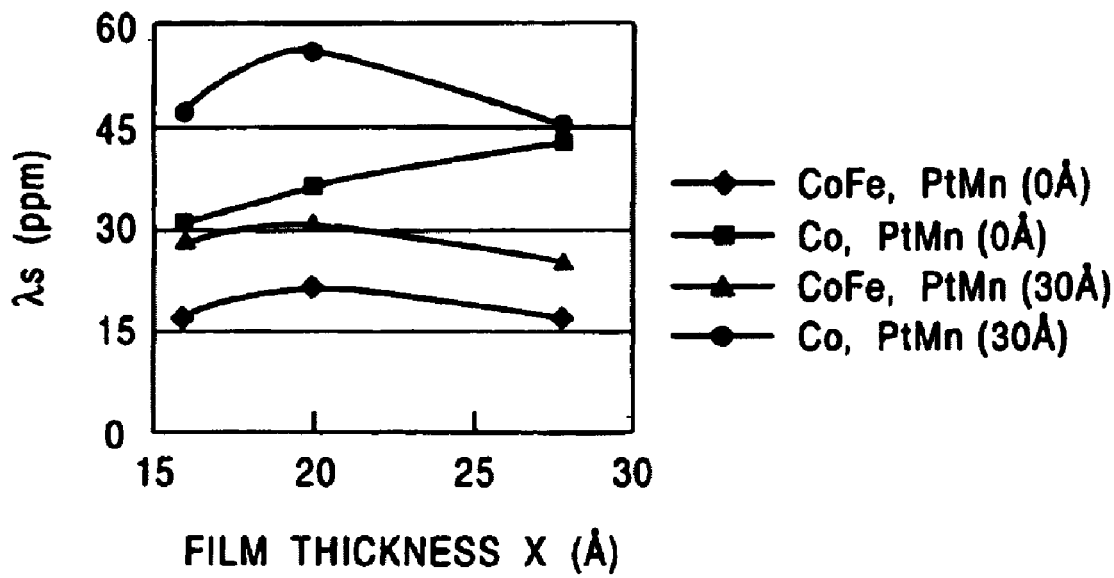
FIG. 25 is a graph showing the changes in magnetostriction constant of CoFe and Co in the case in which a CoFe layer is provided on a PtMn layer and a Co layer is provided on a PtMn layer.

The results are shown in FIG. 25. In both cases in which Co and CoFe were used for forming the first magnetic layer, when the PtMn layer was provided at the lower side, the magnetostriction constant was large as compared to that in the case in which the PtMn layer was not provided. In addition, when the first magnetic layer was made of Co, the magnetostriction constant was large as compared to that in the case in which CoFe was used.

In addition, when the first magnetic layer was made of Co, and the PtMn layer (30 Å) was provided under the first magnetic layer, the magnetostriction constant was increased as the thickness of the first magnetic layer was increased from 16 to 20 Å; however, when the thickness of the first magnetic layer was more than 20 Å, the magnetostriction constant was decreased.

The results indicate that when the thickness of the first magnetic layer is excessively large, the effect of increasing the magnetostriction constant, which is obtained by the strain generated in the vicinity of the interface between the first magnetic layer and the PtMn layer, is decreased.

Next, a PtMn layer was provided on a first magnetic layer, and the changes in magnetostriction constant of Co and CoFe were measured.

The following multilayer film was formed and was then annealed at 290° C. for 4 hours.

The multilayer film had the structure composed of alumina (1,000 Å), (Ni0.8Fe0.2)60Cr40 (52 Å), Cu (85 Å), Ru (9 Å), a first magnetic layer (X Å), $Pt_{50}Mn_{50}$ (0 Å or 30 Å), and Ta (30 Å) provided in that order on a silicon substrate (where the first magnetic layer was $Co_{90}Fe_{10}$ or Co).

For the measurement of the magnetostriction, an optical lever method was used.

Figure 26:
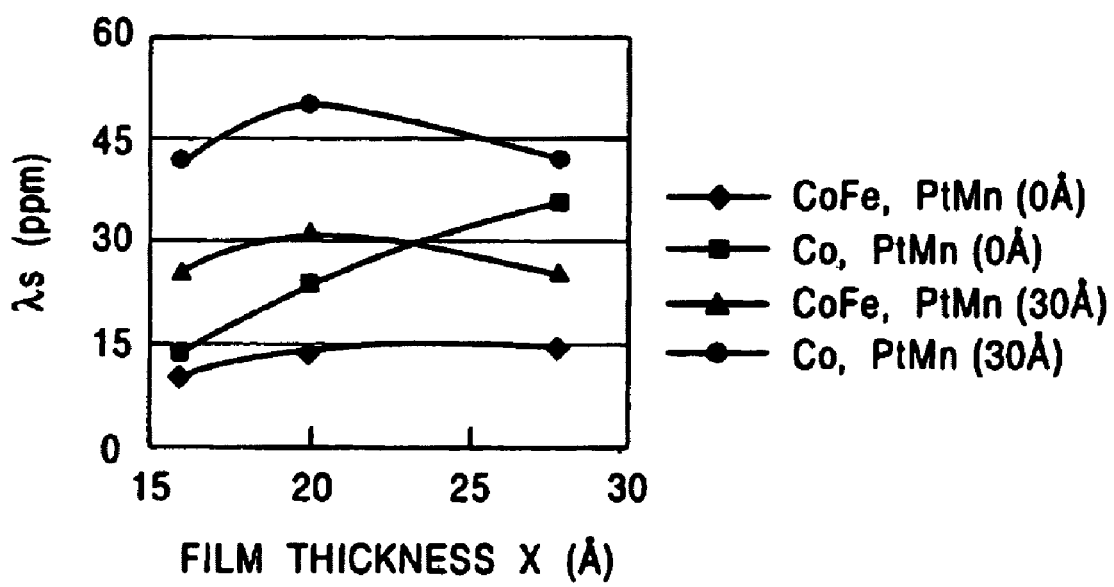
FIG. 26 is a graph showing the changes in magnetostriction constant of CoFe and Co in the cases in which a PtMn layer is provided on a CoFe layer and a PtMn layer is provided on a Co layer.

The results are shown in FIG. 26. When the PtMn layer was formed on the first magnetic layer, the same tendency was obtained as that obtained when the PtMn layer was formed under the first magnetic layer.

That is, in both cases in which Co are CoFe were used for forming the first magnetic layer, when the PtMn layer was provided at the upper side, the magnetostriction constant was large as compared to that in the case in which the PtMn layer was not provided. In addition, when the first magnetic layer was made of Co, the magnetostriction constant was large as compared to that in the case in which CoFe was used. Furthermore, when the first magnetic layer was made of Co, and the PtMn layer (30 Å) was provided on the first magnetic layer, the magnetostriction constant was increased as the thickness of the first magnetic layer was increased from 16 to 19 Å; however, when the thickness of the first magnetic layer was more than 19 Å, the magnetostriction constant was decreased.

Next, a PtMn layer was provided on a multilayer film having a synthetic ferrimagnetic structure, and the magnetostriction was measured. The following multilayer film was formed and was then annealed at 290° C. for 4 hours.

The multilayer film had the structure composed of alumina (1,000 Å), (Ni0.8Fe0.2)60Cr40 (52 Å); $Pt_{50}Mn_{50}$ (30 Å), a first magnetic layer (16 Å), Ru (9 Å), a second magnetic layer (40 Å), Cu (85 Å), and Ta (30 Å) provided in that order on a silicon substrate (where the first magnetic layer and the second magnetic layer were $Co_{90}Fe_{10}$, $Fe_{50}Co_{50}$, or Co).

For the measurement of the magnetostriction, a bending method was used. The bending method is a method in which a uniaxial strain is applied to the multilayer film by bending thereof, and the magnetostriction constant is measured from the change in uniaxial anisotropy caused by a reverse magnetostriction effect. The results are shown in Table 1.

TABLE 1

| First Magnetic Layer | $Co_{90}Fe_{10}$ | Co | $Fe_{50}Co_{50}$ |
|---|---|---|---|
| Second Magnetic Layer | $Co_{90}Fe_{10}$ | Co | $Co_{90}Fe_{10}$ |
| $\lambda_s$ (ppm) | +13.6 | +54.4 | +29.5 |

From those results, it was understood that when the first magnetic layer and the second magnetic layer are formed of Co, the magnetostriction constant is large as compared to that obtained in the case in which CoFe is used.

From the results shown in FIGS. 24 to 26 and Table 1, it was understood that, for example, as shown in FIG. 7, when the nonmagnetic metal layer 60 having the same composition as that of the antiferromagnetic layer 20 and a small thickness (50 Å or less) is provided between the first antiferromagnetic layers 20, the magnetostriction constant at the central portion 17b of the first magnetic layer 17 can be increased. In addition, it was also understood that by the magnetoelastic effect, the magnetization of the central portion 17b of the first magnetic layer 17 can be more stably fixed.

According to the magnetic sensor of the present invention, the intermediate region is formed at the central portion of the element in the track width direction, and at this intermediate region, the antiferromagnetic layer is not provided. Hence, since a sense current is prevented from being shunted to the intermediate region located at the central portion of the element, the reproduction output can be improved. In addition, since heat which is generated by a sense current or a transient current by electrostatic discharge (ESD) and which is liable to concentrate at the central portion of the element in the track width will not reverse the direction of the exchange coupling magnetic field of the antiferromagnetic layer at the central portion (the temperature of each of the antiferromagnetic layers provided at the two side portions of the element is not so much increased), the strength against magnetic electrostatic damage can be improved. In addition, by decreasing the thickness of the central portion of the magnetic sensor, the trend toward narrower gap can be appropriately satisfied. Furthermore, since the direction of magnetization of the free magnetic layer is oriented in the track width direction by the shape anisotropy thereof, for example, means for controlling the magnetization, such as a permanent magnetic layer, is not necessary, and as a result, the structure and the manufacturing method of the element can be simplified.

In addition, even in the case in which a thin nonmagnetic metal layer having the same composition as that of the antiferromagnetic layer is formed at the intermediate region described above, by exploiting the magnetoelastic effect, the force fixing the magnetization of the central portion of the fixed magnetic layer can be further enhanced, and hence a magnetic sensor can be provided which has a large output and which can improve the stability and the symmetry of the output.

What is claimed is:

1. A magnetic sensor comprising: a free magnetic layer in which a direction of magnetization is changed in accordance with an external magnetic field applied thereto; a fixed magnetic layer in which a direction of magnetization is fixed; a nonmagnetic material layer provided between the free magnetic layer and the fixed magnetic layer; and antiferromagnetic layers fixing the magnetization of the fixed magnetic layer by exchange coupling, wherein lengths in a first direction of the free magnetic layer, the nonmagnetic material layer, and the fixed magnetic layer are formed larger than respective widths thereof in a second direction orthogonal to the first direction, the direction of magnetization of the free magnetic layer is preferentially oriented in the first direction by shape anisotropy, the fixed magnetic layer has a multilayer structure composed of a second magnetic layer in contact with the nonmagnetic material layer, an interlayer, and a first magnetic layer provided in that order, the antiferromagnetic layers are provided with an intermediate region having a predetermined length provided therebetween in the first direction so as to be in contact with the first magnetic layer, a direction of magnetization of the first magnetic layer is fixed by the exchange coupling in a direction crossing the first direction, a direction of magnetization of the second magnetic layer is fixed antiparallel to that of the first magnetic layer, electrical resistance is changed by the direction of magnetization of the free magnetic layer and that of the fixed magnetic layer at the intermediate region, a nonmagnetic metal layer is disposed at the intermediate region, the nonmagnetic metal layer having the same composition as that of the antiferromacinetic layers, being in contact with the first magnetic layer, having a small thickness as compared to that of the antiferromagnetic layers to form an irregular crystal structure, a crystal of the nonmagnetic metal layer and a crystal of the fixed magnetic layer at the intermediate region are placed in an epitaxial or a heteroepitaxial state, and the fixed magnetic layer has an open end surface at a face opposing a recording medium, and the entire nonmagnetic metal layer or a part thereof in the vicinity of an interface with the first magnetic layer of the fixed magnetic layer has a face-centered cubic (fcc) structure, and equivalent crystal planes represented by a {111} plane are preferentially oriented in a direction parallel to the interface.

2. The magnetic sensor according to claim 1, wherein the nonmagnetic metal layer has a thickness of 5 to 50 Å.

3. The magnetic sensor according to claim 1, wherein the entire first magnetic layer of the fixed magnetic layer or a part thereof at least at the intermediate region in the vicinity of an interface with the nonmagnetic metal layer has a face-centered cubic (fcc) structure, and equivalent crystal planes represented by a {111} plane are preferentially oriented in a direction parallel to the interface.

4. The magnetic sensor according to claim 3, wherein the first magnetic layer of the fixed magnetic layer comprises Co or $Co_xFe_y$ in which $y \leq 20$ and $x+y=100$ are satisfied.

5. The magnetic sensor according to claim 1, wherein the entire first magnetic layer of the fixed magnetic layer or a part thereof at least at the intermediate region in the vicinity of an interface with the nonmagnetic metal layer has a body-centered cubic (bcc) structure, and equivalent crystal planes represented by a {110} plane are preferentially oriented in a direction parallel to the interface.

6. The magnetic sensor according to claim 5, wherein the first magnetic layer of the fixed magnetic layer comprises $Co_xFe_y$ in which $y \geq 20$ and $x+y=100$ are satisfied.

7. The magnetic sensor according to claim 1, wherein the first magnetic layer of the fixed magnetic layer at least at the intermediate region has a face-centered cubic (fcc) structure in the vicinity of an interface with the nonmagnetic metal layer, in which equivalent crystal planes represented by a {111} plane are preferentially oriented in a direction parallel to the interface, and has a body-centered cubic (bcc) structure in the vicinity of an interface with the interlayer, in which equivalent crystal planes represented by a {110} plane are preferentially oriented in a direction parallel to the interface with the interlayer.

8. The magnetic sensor according to claim 7, wherein the first magnetic layer of the fixed magnetic layer has a composition represented by Co or $Co_xFe_y$ (where $y \leq 20$ and $x+y=100$ are satisfied) in the vicinity of the interface with the nonmagnetic metal layer and has a composition represented by $Co_xFe_y$ (where $y \geq 20$ and $x+y=100$ are satisfied) in the vicinity of the interface with the interlayer.

9. The magnetic sensor according to claim 8, wherein the Fe concentration of the first magnetic layer of the fixed magnetic layer is gradually increased from the interface with the nonmagnetic metal layer to that with the interlayer.

10. The magnetic sensor according to claim 1, wherein a value obtained when a difference between a nearest interatomic distance of the nonmagnetic metal layer in an in-plane direction parallel to the interface with the non-magnetic metal layer and that of the first magnetic layer of the fixed magnetic layer at least at the intermediate region is divided by a nearest interatomic distance of the first magnetic layer is in the range of from 0.05 to 0.20.

11. The magnetic sensor according to claim 1, wherein the first magnetic layer comprises a magnetic material having a positive magnetostriction constant.

12. The magnetic sensor according to claim 1, wherein vertical bias means is not provided for orienting a magnetization of the free magnetic layer in the first direction.

13. A magnetic sensor comprising: a free magnetic layer in which a direction of magnetization is changed in accordance with an external magnetic field applied thereto; a fixed magnetic layer in which a direction of magnetization is fixed; a nonmagnetic material layer provided between the free magnetic layer and the fixed magnetic layer; and a antiferromagnetic layers fixing the magnetization of the fixed magnetic layer by exchange coupling, wherein lengths in a first direction of the free magnetic layer, the nonmagnetic material layer, and the fixed magnetic layer are formed larger than respective widths thereof in a second direction orthogonal to the first direction, the direction of magnetization of the free magnetic layer is preferentially oriented in the first direction by shape anisotropy, the fixed magnetic layer has a multilayer structure composed of a second magnetic layer in contact with the nonmagnetic material layer, an interlayer, and a first magnetic layer provided in that order, the antiferromagnetic layers are provided with an intermediate region having a predetermined length provided therebetween in the first direction so as to be in contact with the first magnetic layer, a direction of magnetization of the first magnetic layer is fixed by the exchange coupling in a direction crossing the first direction, a direction of magnetization of the second magnetic layer is fixed antiparallel to that of the first magnetic layer, electrical resistance is changed by the direction of magnetization of the free magnetic layer and that of the fixed magnetic layer at the intermediate region, a nonmagnetic metal layer is disposed at the intermediate region, the nonmagnetic metal layer having the same composition as that of the antiferromagnetic layers, being in contact with the first magnetic layer, having a small thickness as compared to that of the antiferromagnetic layers to form an irregular crystal structure, a crystal of the non magnetic metal layer and a crystal of the fixed magnetic layer at the intermediate region are placed in an epitaxial or a heteroepitaxial state, and the fixed magnetic layer has an open end surface at a face opposing a recording medium, and the first magnetic layer of the fixed magnetic layer at least at the intermediate region has a face-centered cubic (fcc) structure in the vicinity of an interface with the nonmagnetic metal layer, in which equivalent crystal planes represented by a {111} plane are preferentially oriented in a direction parallel to the interface, and has a body-centered cubic (bcc) structure in the vicinity of an interface with the interlayer, in which equivalent crystal planes represented by a {110} plane are preferentially oriented in a direction parallel to the interface with the interlayer.

14. The magnetic sensor according to claim 13, wherein the first magnetic layer of the fixed magnetic layer has a composition represented by Co or $Co_xFe_y$ (where $y \leq 20$ and $x+y=100$ are satisfied) in the vicinity of the interface with the nonmagnetic metal layer and has a composition represented by $Co_xFe_y$ (where $y \geq 20$ and $x+y=100$ are satisfied) in the vicinity of the interface with the interlayer.

15. The magnetic sensor according to claim 13, wherein the Fe concentration of the first magnetic layer of the fixed magnetic layer is gradually increased from the interface with the non magnetic metal layer to that with the interlayer.

16. The magnetic sensor according to claim 13, wherein a value obtained when a difference between a nearest interatomic distance of the nonmagnetic metal layer in an in-plane direction parallel to the interface with the nonmagnetic metal layer and that of the first magnetic layer of the fixed magnetic layer at least at the intermediate region is divided by a nearest interatomic distance of the first magnetic layer is in the range of from 0.05 to 0.20.

17. The magnetic sensor according to claim 13, wherein the first magnetic layer comprises a magnetic material having a positive magnetostriction constant.

18. The magnetic sensor according to claim 13, wherein vertical bias means is not provided for orienting a magnetization of the free magnetic layer in the first direction.

19. The magnetic sensor according to claim 13, wherein the nonmagnetic metal layer has a thickness of 5 to 50 Å.

20. A magnetic sensor comprising: a free magnetic layer in which a direction of magnetization is changed in accordance with an external magnetic field applied thereto; a fixed magnetic layer in which a direction of magnetization is fixed; a nonmagnetic material layer provided between the free magnetic layer and the fixed magnetic layer; and a antiferromagnetic layers fixing the magnetization of the fixed magnetic layer by exchange coupling, wherein lengths in a first direction of the free magnetic layer, the non magnetic material layer, and the fixed magnetic layer are formed larger than respective widths thereof in a second direction orthogonal to the first direction, the direction of magnetization of the free magnetic layer is preferentially oriented in the first direction by shape an isotropy, the fixed magnetic layer has a multilayer structure composed of a second magnetic layer in contact with the nonmagnetic material layer, an interlayer, and a first magnetic layer provided in that order, the antiferromagnetic layers are provided with an intermediate region having a predetermined length provided therebetween in the first direction so as to be in contact with the first magnetic layer, a direction of magnetization of the first magnetic layer is fixed by the exchange coupling in a direction crossing the first direction, a direction of magnetization of the second magnetic layer is fixed antiparallel to that of the first magnetic layer, electrical resistance is changed by the direction of magnetization of the free magnetic layer and that of the fixed magnetic layer at the intermediate region, a nonmagnetic metal layer is disposed at the intermediate region, the nonmagnetic metal layer having the same composition as that of the antiferromagnetic layers, being in contact with the first magnetic layer, having a small thickness as compared to that of the antiferromagnetic layers to form an irregular crystal structure, a crystal of the nonmagnetic metal layer and a crystal of the fixed magnetic layer at the intermediate region are placed in an epitaxial or a heteroepitaxial state, and the fixed magnetic layer has an open end surface at a face opposing a recording medium, and a value obtained when a difference between a nearest interatomic distance of the nonmagnetic metal layer in an in-plane direction parallel to the interface with the non-magnetic metal layer and that of the first magnetic layer of the fixed magnetic layer at least at the intermediate region is divided by a nearest interatomic distance of the first magnetic layer is in the range of from 0.05 to 0.20.

21. The magnetic sensor according to claim 20, wherein the nonmagnetic metal layer has a thickness of 5 to 50 Å.

22. The magnetic sensor according to claim 20, wherein the entire first magnetic layer of the fixed magnetic layer or a part thereof at least at the intermediate region in the vicinity of an interface with the nonmagnetic metal layer has a face-centered cubic (fcc) structure, and equivalent crystal planes represented by a {111} plane are preferentially oriented in a direction parallel to the interface.

23. The magnetic sensor according to claim 22, wherein the first magnetic layer of the fixed magnetic layer comprises Co or $Co_xFe_y$ in which $y \leq 20$ and $x+y=100$ are satisfied.

24. The magnetic sensor according to claim 20, wherein the entire first magnetic layer of the fixed magnetic layer or a part thereof at least at the intermediate region in the vicinity of an interface with the nonmagnetic metal layer has a body-centered cubic (bcc) structure, and equivalent crystal planes represented by a {110} plane are preferentially oriented in a direction parallel to the interface.

25. The magnetic sensor according to claim 24, wherein the first magnetic layer of the fixed magnetic layer comprises $Co_xFe_y$ in which $y \geq 20$ and $x+y=100$ are satisfied.

26. The magnetic sensor according to claim 20, wherein the first magnetic layer comprises a magnetic material having a positive magnetostriction constant.

27. The magnetic sensor according to claim 20, wherein vertical bias means is not provided for orienting a magnetization of the free magnetic layer in the first direction.

* * * * *